US010311921B1

(12) United States Patent
Parkinson et al.

(10) Patent No.: US 10,311,921 B1
(45) Date of Patent: Jun. 4, 2019

(54) MULTIPLE-MODE CURRENT SOURCES FOR SENSE OPERATIONS

(71) Applicant: SanDisk Technologies LLC, Plano, TX (US)

(72) Inventors: Ward Parkinson, Boise, ID (US); Thomas Michael Trent, Tucson, AZ (US); James Edwin O'Toole, Boise, ID (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/858,535

(22) Filed: Dec. 29, 2017

(51) Int. Cl.
G11C 7/00 (2006.01)
G11C 7/12 (2006.01)
G11C 8/08 (2006.01)
G11C 7/06 (2006.01)

(52) U.S. Cl.
CPC .............. G11C 7/12 (2013.01); G11C 7/06 (2013.01); G11C 8/08 (2013.01)

(58) Field of Classification Search
CPC ..... G11C 13/0026; G11C 13/004; G11C 7/12; G11C 13/0028; G11C 16/24; G11C 16/26
See application file for complete search history.

(56) References Cited

U.S. PATENT DOCUMENTS

2005/0185445 A1* 8/2005 Osada ................ G11C 13/0004
365/148
2007/0104002 A1* 5/2007 Edahiro ................... G11C 7/06
365/203
2007/0147128 A1* 6/2007 Edahiro .................... G11C 7/12
365/185.21
2016/0118113 A1* 4/2016 Siau .................. G11C 13/0069
365/51
2016/0141334 A1* 5/2016 Takaki ................. H01L 27/249
257/5

OTHER PUBLICATIONS

Kwang-Jin Lee et al., "A 90 nm 1.8 V 512 Mb Diode-Sswitch PRAM With 266 MB/s Read Throughput", IEEE Journal of Sold-State Circuits, vol. 43, No. 1, Jan. 2008, pp. 105-163.
Li Xi et al., "Design and analysis of a high-performance sense amplifier for Phase-Change Memory", 2011, IEEE, pp. 318-321.

* cited by examiner

Primary Examiner — Tuan T Nguyen
(74) Attorney, Agent, or Firm — Brinks Gilson & Lione

(57) ABSTRACT

A bit line read voltage generator may operate in a high drive strength or current mode to drive a selected bit line voltage to a read selected bit line voltage at a high level, and then may switch to operating in a low drive strength or current mode. Doing so may control, such as by limiting, the amount of cell current if the selected memory cell turns on, reducing the likelihood of false writes. Also, a word line read voltage generator may operate in a high drive strength or current mode to ramp up a selected word line voltage level, and then may switch to operating in a low drive strength or current mode to shorten the time for a global selected word line voltage to decrease to below a trip level and/or to control an amount of the cell current when the selected memory cell turns on.

20 Claims, 7 Drawing Sheets

MULTIPLE-MODE CURRENT SOURCES FOR SENSE OPERATIONS

BACKGROUND

In storage devices that utilize memory cells having select elements, to read data from a selected one of the memory cells, read voltage supplies may supply read voltages to a memory tile to generate a voltage difference across the selected memory cell that exceeds a threshold voltage level of the select element. A logic level of data stored in a memory element of the selected memory cell may depend on whether the memory element is in a high resistance state or a low resistance state. In the event that the selected memory cell is in the low resistance state, generation of the voltage difference in excess of the select element's threshold voltage level may cause a relatively large amount of current to flow through the selected memory cell. If the memory cell current is at too high of a level for too long of a period of time, the memory cell current may cause a "false write" in which the selected memory element changes its state from the low resistance state to the high resistance state, effectively causing the selected memory element to change the logic value of the data it is storing.

In addition, data stored in memory cells may be read by changing voltage levels at which selected bit lines and word lines are biased. The changes in the voltage levels may cause voltage changes in neighboring word lines and bit lines due to coupling capacitance. If the change in voltage on the selected bit lines and word lines is not performed at appropriate times or changed at appropriate rates, the change in voltage on the neighboring word lines and bit lines may create "false select" situations where the neighboring word lines and bit lines become selected. Ways to perform read operations that minimize the likelihood of false write or false selects from occurring while still aiming to perform the read operations as fast as possible may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

Figure 1A:
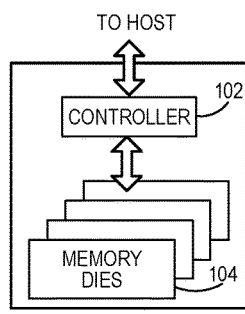
FIG. 1A is a block diagram of an example memory system.

By way of introduction, the below embodiments relate to apparatuses, devices, systems, circuits and methods for biasing word lines and bit lines during sense operations performed during read operations to read data from memory. In a first embodiment, a circuit includes a memory array that includes a plurality of memory cells, and sense circuit, and a voltage generator. The sense circuit is configured to sense a global selected word line voltage of a selected word line, and output a sense result signal indicative of a logic level of data stored in a selected memory cell coupled to the selected word line. The voltage generator is configured to: set a global selected bit line voltage to a selected bit line voltage level according to a drive strength at an initial drive strength level, decrease the drive strength of the voltage supply from the initial drive strength level to a decreased drive strength level in response to the global selected bit line select voltage set to the selected bit line voltage level, and in response to the selected memory cell of the plurality of memory cells turning on, control a memory cell current through the selected memory cell according to the decreased drive strength level.

In some embodiments, the voltage generator includes: a first current branch configured to set the global selected bit line voltage according to the drive strength at the initial drive strength level, and a second current branch configured to set the global selected bit line voltage according to the drive strength at the decreased drive strength level.

In some embodiments, a controller is configured to: activate the first current branch to set the global selected bit line voltage according to the drive strength at the initial drive strength level, and deactivate the first current branch to set the global bit line voltage according to the drive strength at the decreased drive strength level.

In some embodiments, the voltage generator is configured to: decrease the global selected bit line voltage from an unselected bit line voltage level to the selected bit line voltage level according to the drive strength at the initial drive strength level during an initial portion of a bit line set period of a sense operation, and maintain the global selected bit line voltage at the selected bit line voltage level during a remaining portion of the bit line set period and a word line set period.

In some embodiments, the first current branch is configured to draw a first branch current at a first branch current level, and the second branch current is configured to draw a second branch current at a second branch current that is lower than the first branch current level.

In some embodiments, the selected memory cell is configured to turn on during a sense operation when programmed in a low resistance state, and when turned on, is configured to conduct a spiked portion and a decaying portion of the memory cell current during a memory cell response period, and wherein the voltage generator is configured to conduct a global bit line current according to the drive strength at the reduced drive strength level during the memory cell response period.

In some embodiments, the voltage generator is configured to sink a global bit line current from a global selected bit line node according to the drive strength at the reduced drive strength level in order to control the memory cell current.

In a second embodiment, a circuit includes: a memory array comprising a plurality of memory cells, a current supply, a clamp circuit, and a selected memory cell of the plurality of memory cells. The current supply is configured to: generate a current at a first current level to initially set a selected bit line voltage of a selected bit line to a selected bit line voltage level, and generate the current at a second current level lower than the first current level in response to the selected bit line voltage initially set to the selected bit line voltage level. The clamp circuit is configured to clamp a selected word line voltage of a selected word line to a clamp voltage level. The selected memory cell is coupled to the selected bit line and the selected word line, and configured to: turn on in response to being biased with the selected bit line voltage at the selected bit line voltage level, and in response to turning on, form a current path comprising the clamp circuit, the selected memory cell, and the current supply, the current path configured to draw a memory cell current dependent on the source current at the second current level.

In some embodiments, the current supply includes: a first current branch configured to initially set the selected bit line voltage to the selected bit line voltage level, and a second current branch configured to maintain the selected bit line voltage at the selected bit line voltage level.

In some embodiments, a controller is configured to: activate the first current branch to initially set the selected bit line voltage to the selected bit line voltage level, and deactivate the first current branch to maintain the global bit line voltage at the selected bit line voltage level.

In some embodiments, the current supply is configured to: generate the current at the first current level to decrease the selected bit line voltage from an unselected bit line voltage level to the selected bit line voltage level during an initial portion of a bit line set period of a sense operation, and generate the current at the second current level to maintain the global selected bit line voltage at the selected bit line voltage level during a remaining portion of the bit line set period and a word line set period.

In some embodiments, the selected memory cell is configured to turn on during a sense operation when programmed in a low resistance state, and when turned on, is configured to conduct a spiked portion and a decaying portion of the memory cell current during a memory cell response period, and wherein the current supply is configured to conduct a global bit line current at the second current level.

In a third embodiment, a circuit includes: a memory array comprising a plurality of memory cells, and a current supply. The current supply is configured to: supply a current at a first current level to ramp up a global selected word line voltage to a read selected word line voltage level configured for reading data stored in a selected memory cell of the plurality of memory cells, and in response to the global selected word line voltage reaching the read selected word line voltage level: decrease the current from the first current level to a second current level lower than the first current level, and supply the current at the second current level to generate the global selected word line voltage.

In some embodiments, the current supply includes: a first current branch configured to generate a first branch current at a first branch current level, and a second current branch configured to generate a second branch current at a second branch current level. The first current level comprises a sum of the first branch current level and the second branch current level.

In some embodiments, the second current level comprises the second branch current and not the first branch current.

In some embodiments, the current supply is further configured to: activate both the first current branch and the second current branch to generate the current at the first current level, and deactivate the first current branch and keep the second current branch activated to decrease the current from the first current level to the second current level.

In some embodiments, the first branch current level is higher than the second branch current level.

In some embodiments, the selected memory cell is configured to turn on when programmed in a low resistance state and when a selected word line voltage reaches the read selected word line level, and when turned on, is configured to conduct a memory cell current comprising a decaying portion following a spiked portion during a memory cell response period, and wherein the current supply is configured to supply the current at the second current level when the selected memory cell is turned on during the memory cell response period.

In some embodiments, the selected memory cell is configured to stay turned off during the memory cell response period when programmed in a high resistance state and when the selected word line voltage reaches the read selected word line level, and wherein the current supply is configured to supply the current at the second current level when the selected memory cell is turned off during the memory cell response period.

In some embodiments, the selected memory cell includes a memory element and a select element.

In a fourth embodiment, a circuit includes: a memory array comprising a plurality of memory cells; means for setting a global selected bit line voltage to a selected bit line voltage level according to a drive strength at an initial drive strength level; means for decreasing the drive strength of the voltage supply from the initial drive strength level to a decreased drive strength level in response to the global selected bit line select voltage set to the selected bit line voltage level; and means for controlling a memory cell current through the selected memory cell according to the decreased drive strength level in response to the selected memory cell turning on.

In some embodiments, the circuit further includes: means for setting the global selected bit line voltage according to the drive strength at the initial drive strength level; and means for setting the global selected bit line voltage according to the drive strength at the decreased drive strength level.

In some embodiments, the circuit further includes: means for activating the first current branch to set the global selected bit line voltage according to the drive strength at the initial drive strength level, and means for deactivating the first current branch to set the global bit line voltage according to the drive strength at the decreased drive strength level.

Other embodiments are possible, and each of the embodiments can be used alone or together in combination. Accordingly, various embodiments will now be described with reference to the attached drawings.

EMBODIMENTS

The following embodiments describe apparatuses, devices, systems, circuits, and methods for biasing word lines and bit lines during sense operations performed during read operations to read data from memory. The actions performed to bias the word lines and bit lines may minimize the likelihood of false writes and/or false selects from occurring during the sense operations and/or to reduce time durations of the sense operations. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104. In some embodiments, the controller 102 may be located on the memory die 104. In other embodiments, the controller 102 may be on its own and connect to a control one or more memory die or chip as a die separate from the memory dice 104.

The controller 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific memory areas (e.g., blocks of memory) that would otherwise be repeatedly written to) and garbage collection (after a memory area (e.g., a block) is full, moving only the valid portions (e.g., pages) of data to a new memory area (e.g., a new block), so the initial memory area can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the memory die(s) 104. However, the subject matter described herein is not limited to memory systems having a single memory channel. For example, in some memory systems, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
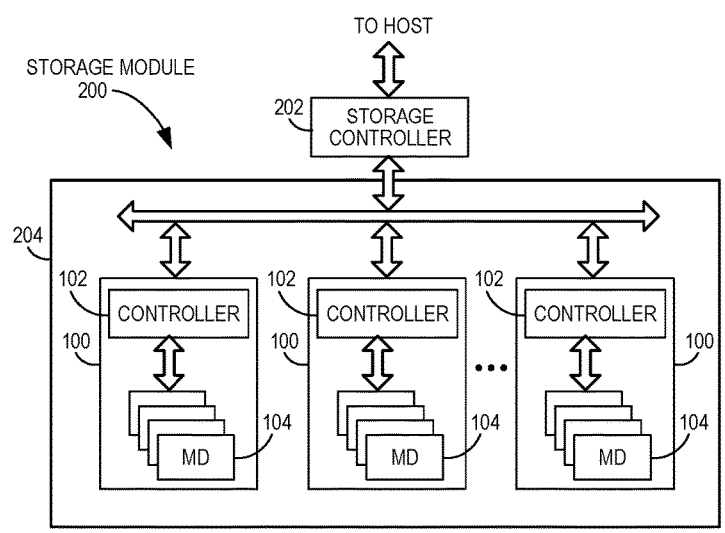
FIG. 1B is a block diagram of a storage module that includes a plurality of memory systems.

FIG. 1B illustrates a storage module 200 that includes a plurality of memory systems 100. As such, the storage module 200 may include a storage controller 202 that interfaces with a host and with a storage system 204, which includes a plurality of memory systems 100. The interface between the storage controller 202 and the memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
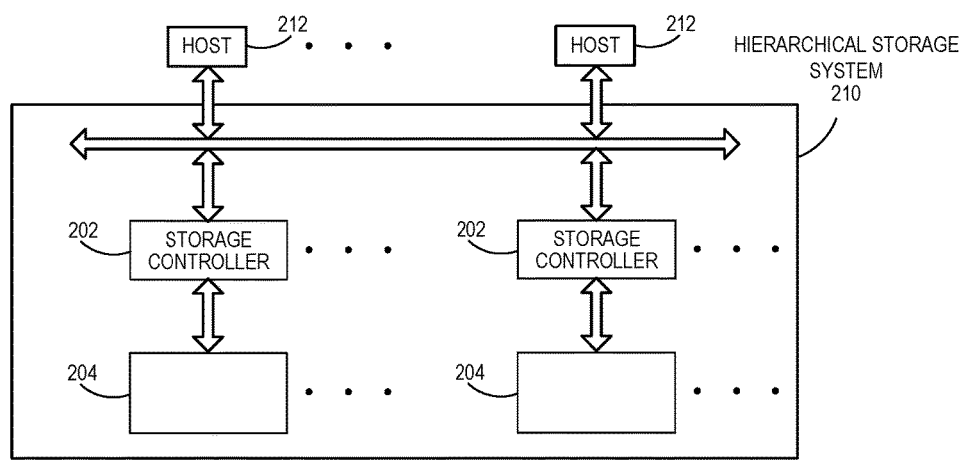
FIG. 1C is a block diagram of a hierarchical storage system.

FIG. 1C is a block diagram illustrating a hierarchical storage system 210. The hierarchical storage system 210 may include a plurality of storage controllers 202, each of which controls a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
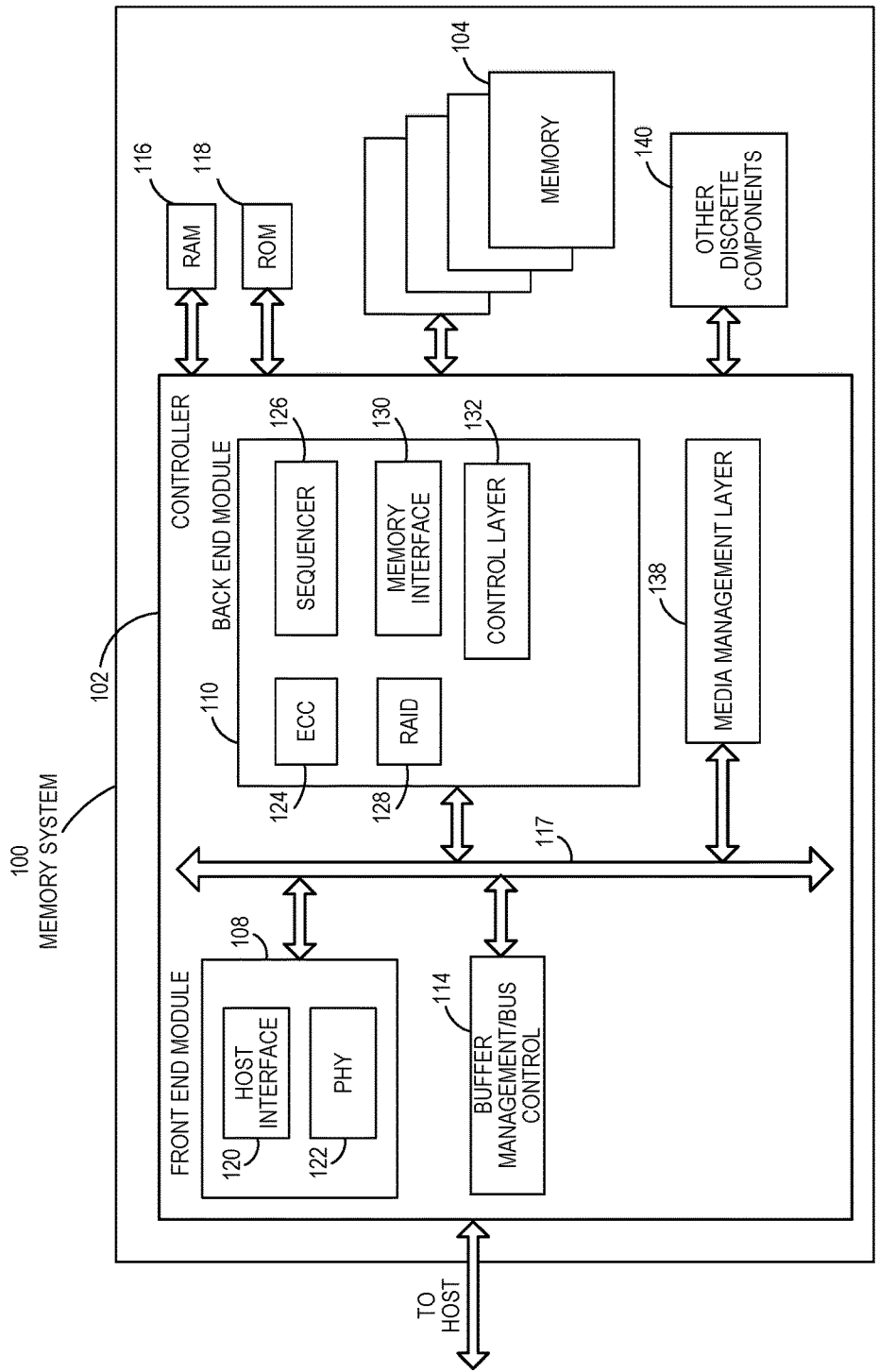
FIG. 2A is a block diagram of example components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, DDR4, LPDDR4, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124. A memory interface 130 provides the command sequences to the memory die(s) 104 and receives status information from the memory die(s) 104. Along with the command sequences and status information, data to be programmed into and read from the memory die(s) 104 may be communicated through the memory interface 130. In one embodiment, the memory interface 130 may be a double data rate (DDR) interface and/or a Toggle Mode 200, 400, 800, 1,000 or higher interface. A control layer 132 may control the overall operation of back end module 110.

Additional modules of the non-volatile memory system 100 illustrated in FIG. 2A may include a media management layer 138, which performs wear leveling of memory cells of the memory dies 104, address management, and/or facilitates folding operations. The memory system 100 may also include other discrete components 140, such as external electrical interfaces, external RAM, resistors, capacitors, or other components that may interface with controller 102. In some example embodiments, one or more of the RAID module 128, the media management layer 138, and buffer management/bus controller 114 are optional components that may not be included in the controller 102.

Figure 2B:
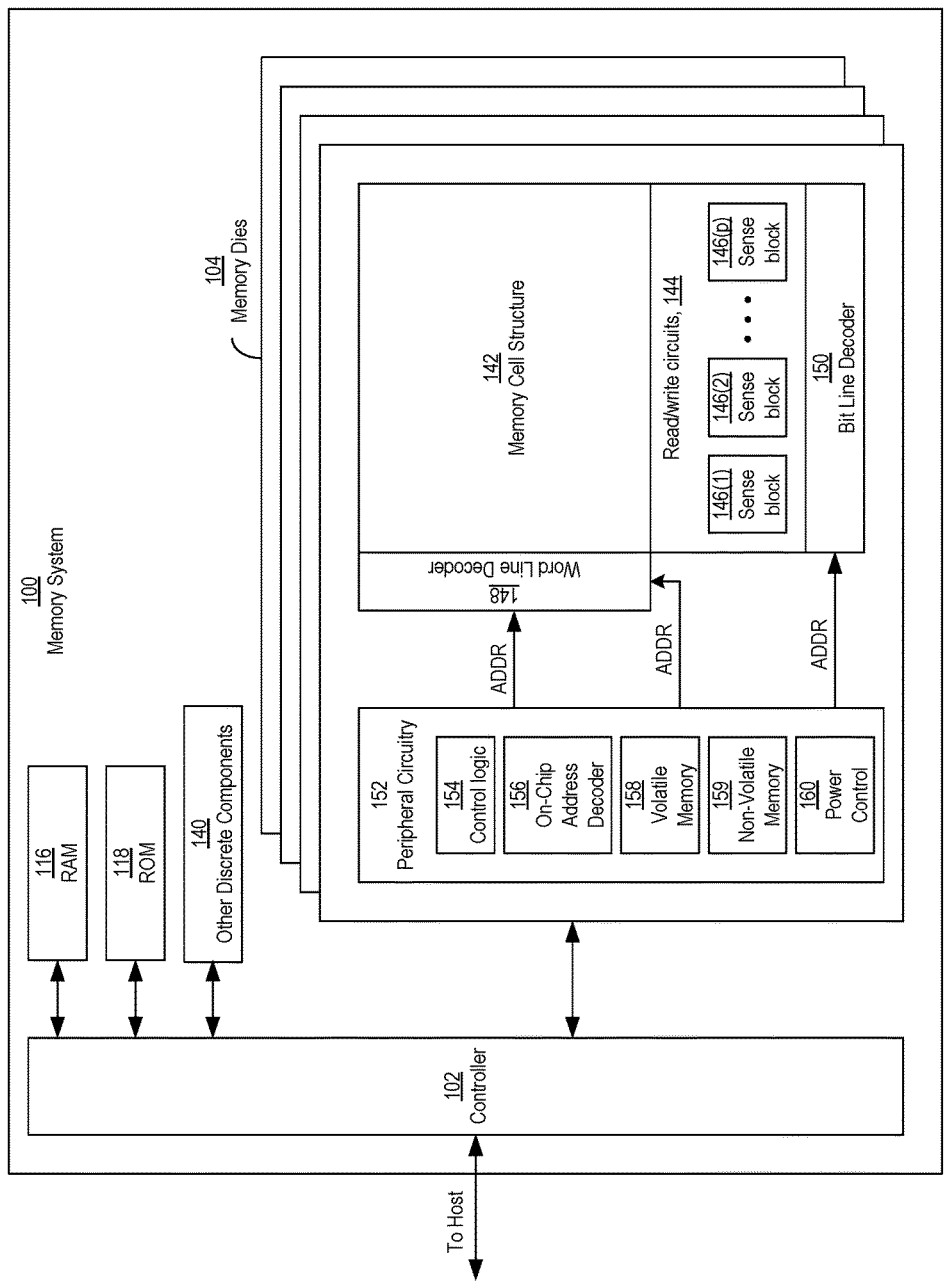
FIG. 2B is a block diagram of example components of a memory die of the memory system of FIG. 1A.

FIG. 2B is a block diagram illustrating exemplary components of a memory die 104 in more detail. The memory die 104 may include a memory cell structure 142 that includes a plurality of memory cells. For some example configurations, the memory cells may be arranged in a two-dimensional or three-dimensional array. For such example configurations, the memory cell structure 142 may be referred to as a memory array.

Example types of memory cells of the memory cell structure 142 include those that have a memory element or portion and a select element or portion. The memory element of the memory cell may be configured to store data at one of a plurality of n-bit logic values, where n is an integer of one or more. Each n-bit logic value may be a binary value, where n represents the number of digits of the binary value. For example, where n is one, the plurality of 1-bit logic values includes a logic 1 value and a logic 0 value. To store the data at an n-bit logic value, the memory element may be configured to be programmed into one of a plurality of states, with each state corresponding to a respective one of a plurality of n-bit logic values. For some example configurations, the states may be resistance states, where different states correspond to different resistances or resistance values of the memory element. For example, a first state may be a high resistance state and a second state may be a low resistance state. A memory element programmed in the high resistance state has a higher resistance than when programmed in the low resistance state. In addition or alternatively, the states may be threshold voltage states, where different states correspond to different threshold voltages to turn on and/or conduct a predetermined, threshold amount of current.

The select element (alternatively referred to as a selector or a selector element or selector portion) may enable the memory element to be programmed to store data or may enable data to be read from the memory element, but itself does not store data or have storage capabilities. In addition or alternatively, the select element may have an associated threshold voltage, and may turn on to conduct current when biased with a voltage at or that exceeds the threshold voltage. The biasing of the select element with a voltage at or above the threshold voltage may allow the memory element to be programmed or read from.

Example types of memory for the memory element, or the memory cell generally, may include resistive random access memory ("ReRAM") or phase change memory ("PCM") although other types of memory, including volatile or other non-volatile memory, may be possible. Additionally, non-limiting example types of select elements include an ovonic threshold switch ("OTS"), a doped chalcogenide alloy material, a thin film silicon material, a metal-metal oxide switch, or a Field Assisted Superlinear Threshold select ("FAST"). In addition or alternatively, the memory cells of the memory cell structure 142 may be configured as cross-point (e.g., 3D XPoint) memory.

The memory cell structure 142 located within and/or over a substrate may be arranged in two or three dimensions, such as a two dimensional memory structure or a three dimensional memory structure with a layer or layers of memory above the base memory layer.

In a two-dimensional memory structure, the memory cells are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory cells may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

In a three-dimensional memory structure, the memory cells of an array is arranged so that memory cells occupy multiple planes or multiple memory device levels, thereby forming a structure in three dimensions (i.e., in the x, y and z directions, where the one of the directions is substantially perpendicular and the other directions are substantially parallel to the major surface of the substrate).

Additional ways of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

Figure 3:
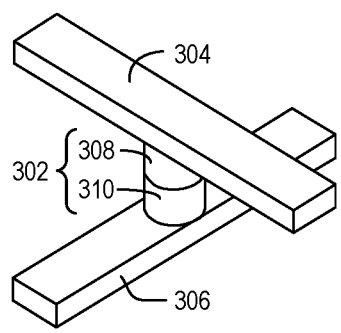
FIG. 3 is a perspective view of an example memory cell coupled to a word line and a bit line.

FIG. 3 shows a perspective view of a memory cell 302 coupled to a word line 304 and a bit line 306. The memory cell 302 may be representative of an example memory cell of the memory cell structure 142 shown in FIG. 2B. Additionally, the word line 304 and the bit line 306 may be representative of respective portions of a word line and a bit line coupled to a memory cell of the memory cell structure 142. Physically, the memory cell 302 may be disposed in between the word line 304 and the bit line 306. Also, in some example configurations, as shown in FIG. 3, the word line 304 and the bit line 306 may be oriented in planes parallel with each other, and extend in perpendicular directions to each other in their respective planes. Additionally, although not shown in FIG. 3, the word line 304 may be one of a plurality word lines extending parallel with each other in an associated plane, and similarly, the bit line 306 may be one of a plurality of bit lines extending parallel with each other in an associated plane.

Additionally, in the example configuration shown in FIG. 3, the memory cell 302 may include a memory element 308 and a select element 310. The memory element 308 and the select element 310 may be coupled to each other. Additionally, in the example configuration shown in FIG. 3, the memory element 308 may be adjacent and/or coupled to the word line 304, and the select element 310 may be adjacent and/or coupled to the bit line 306. In other example configurations, the memory element 308 may be adjacent and/or coupled to the bit line 306, and the select element 310 may be adjacent and/or coupled to the word line 304. A word line is also known as a row line, an interchangeable label as used herein. A bit line may be known as a column line, an interchangeable label as used herein. And what is called a word line line herein can just as well be labeled a bit line, and a bit line labeled as word line so long as consistent in the swapping one for the other.

The memory element 308 and the select element 310 may each have an associated threshold voltage. The level of the threshold voltage of the memory element 308 may depend on and/or correspond to a state in which the memory element 308 is programmed and/or a data or logic value of the data that the memory element 308 is storing. In some example configurations, the memory element 308 may be configured to store a single bit of data at either a logic 1 value or a logic 0 value. The memory element 308 may be programmed in either a high resistance state to store the logic 1 value or a low resistance state to store the logic 0 value, or alternatively in the high resistance state to store the logic 0 value and in the low resistance state to store the logic 1 value. The memory element 308 may have a higher threshold voltage when programmed in the high resistance state than when programmed in the low resistance state.

Additionally, for some example configurations, the memory cell 302 may have an associated or total threshold voltage based on a combination of the threshold voltage of the memory element 308 and the threshold voltage of the select element 310. In particular example configurations, the memory element 308 and the select element 310 may be coupled or connected to each other in series such that the total threshold voltage of the memory cell 302 is the sum of the threshold voltage of the memory element 308 and the threshold voltage of the select element 310, or close thereto when a threshold current to trigger on the memory element 310 is approximately the same as the threshold current to trigger on the select element.

As described in further detail below, a read voltage difference may be applied across the memory cell 302 to read data from the memory cell 302, such as by sending or determining the logic level of the data that the memory cell 302 is storing. The voltage difference may be a difference of a first voltage generated at or on the word line 304 and a second voltage generated at or on the bit line 306. The memory cell 302 may be configured to turn on in response to the read voltage difference being at or above the total threshold voltage of the memory cell 302. When not turned on, the memory cell 302 may be considered turned off and impose a relatively high impedance across the memory cell 302. Also, when turned on, the memory cell 302 may be configured to conduct a cell current. Alternatively, when turned off, the memory cell 302 may instead conduct a relatively smaller cell current.

To sense or determine the logic level of the data that the memory cell 302 is storing, the read voltage applied between a selected word line and a selected bit line may be generated at a voltage level that is greater than the threshold voltage of the select element 310, and may be less than the level of the total threshold voltage of the memory cell 302; e.g. the threshold voltage of the select element 310 and the memory element 308 if programmed in the high resistance state. This way, whether or not the memory cell 302 conducts cell current in response to the read voltage difference may indicate the logic level (e.g., either a logic 1 value or a logic 0 value) of the data that the memory cell 302 (or particularly the memory element 308) is storing. Whether the memory cell 302 conducts current in response to being biased with the read voltage difference may be referred to as the read response of the memory cell. A read operation to read data from a memory cell is described in further detail below.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming the memory cells.

The memory die 104 may also include a word line decoder (otherwise referred to as a row decoder or an x decoder) 148 and a bit line address (otherwise referred to as a column decoder or a y decoder) 150. The word line decoder 148 may decode a word line address (otherwise referred to as a row address or an x address) and select a particular word line corresponding to the decoded word line address when reading or writing data to/from the memory cells. The bit line decoder 150 may decode a bit line address (otherwise referred to as a column address or a y address) to select a bit line or a particular group of bit lines corresponding to the bit line address when reading or writing data to/from the memory cells.

In addition, the non-volatile memory die 104 may include peripheral circuitry 152. The peripheral circuitry 152 may include control logic circuitry (otherwise referred to as a controller or an on-chip controller) 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158 and non-volatile memory 159 other than or separate from the memory cell structure 142. The volatile and non-volatile memory 158, 159 may be used to store data or other information on the memory die 104, such as for access or alternatives by the control logic 154 or another component of the peripheral circuitry 152 for performance of memory operations on the memory die 104. Such memory may also serve as firmware in controlling on-chip micro-sequences. An example configuration of the volatile memory 158 may include latches, although other configurations are possible.

In addition, the peripheral circuitry 152 may include power control circuitry 160 that is configured to generate and supply voltages to the memory cell structure 142 and/or the word lines and bit lines coupled to the memory cells of the memory cell structure 142, and/or bias memory cells of the memory cell structure and/or the word lines and bit lines coupled to the memory cells with voltages at certain levels. The voltages that the power control circuitry 160 supplies includes read voltages, program voltages (including program voltage pulses), erase voltages (including erase voltage pulses), as well as other voltages that may be supplied to the word lines and bit lines of the memory cell structure 142, the read/write circuits 144, including the sense blocks 146, and/or other circuit components on the memory die 104. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations. For clarity, and unless otherwise specified, the combination of the power control circuitry 160, the read/write circuitry 144, and the sense blocks 146 used to bias word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof. The voltage supply circuitry may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible.

Figure 4:
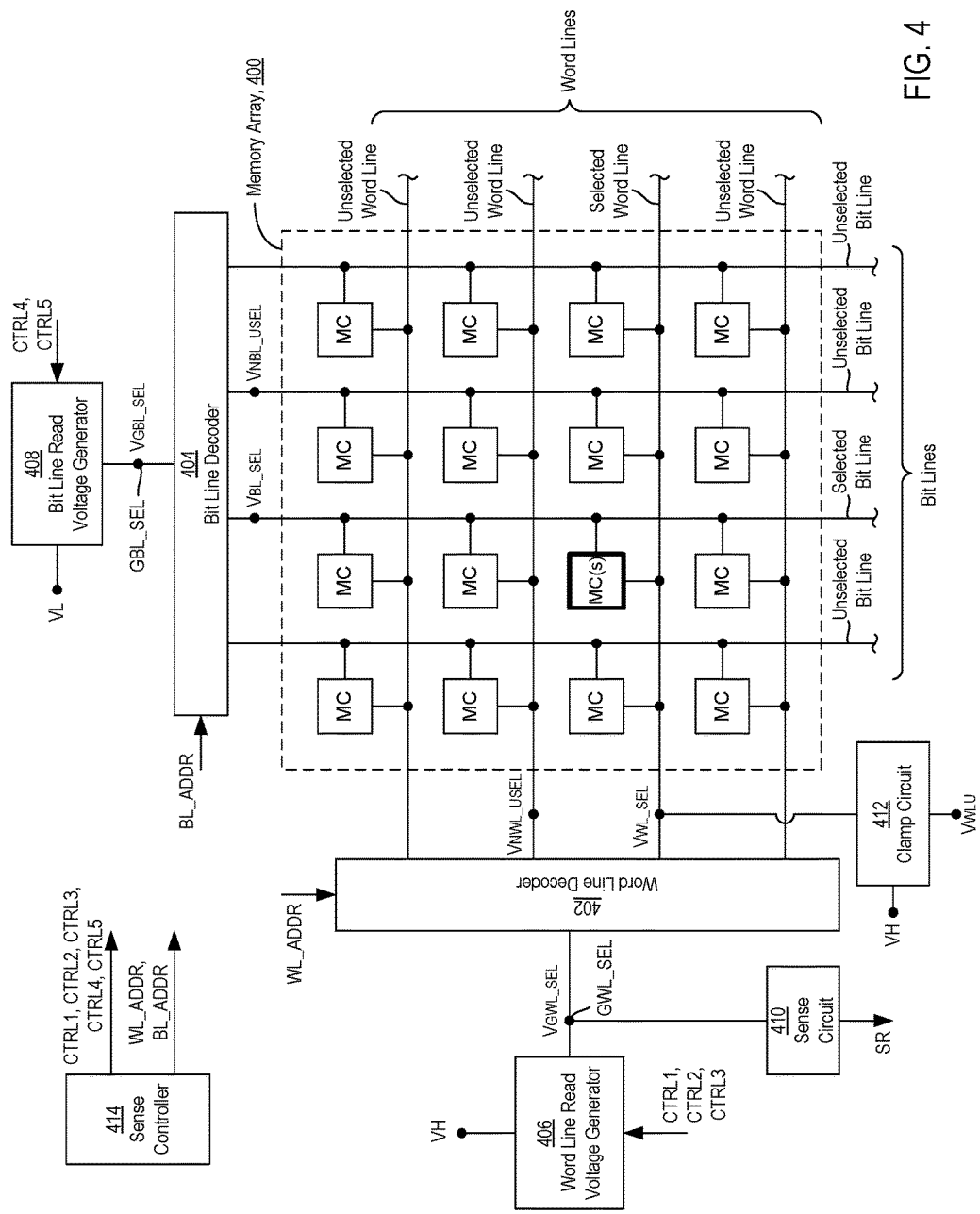
FIG. 4 is a block diagram of example read circuitry coupled to a memory array.

FIG. 4 is a block diagram of example read circuitry configured to perform a sense operation to sense cell current Icell through a selected memory cell MC(s). The selected memory cell MC(s) may be one of a plurality of memory cells MC configured in a memory array 400. The memory array 400 may represent at least a portion of the memory cell structure 142 of FIG. 2B.

The example read circuitry may perform the sense operation to read data stored in the selected memory cell MC(s). An amount of the cell current Icell that flows through the selected memory cell MC(s) may indicate a logic value of data stored in the selected memory cell MC(s). The read circuitry may be configured to sense the cell current Icell in order to determine the logic value of the data.

The read circuitry configured to perform and/or be involved in the sense operation may include a word line decoder 402, a bit line decoder 404, a word line read voltage generator 406, a bit line read voltage generator 408, a sense circuit 410, a clamp circuit 412, and a sense controller 414. The word line decoder 402 may represent at least a portion of the word line decoder 148 of FIG. 2B, the bit line decoder 404 may represent at least a portion of the bit line decoder 150 of FIG. 2B, the word line read voltage generator 406 and the bit line read voltage generator 408 may be components of the voltage supply circuitry. The sense controller 414 may be configured to control a sense operation, and may be a component of the control logic 154 of FIG. 2B.

As described in further detail below, during a sense operation, the word line read voltage generator 406 may be configured to operate in multiple drive strength, or current modes of operation, and/or the bit line read voltage generator 408 may be configured to operate in multiple drive strength, or current modes, of operation. For configurations where a given one of the read voltage generators (either the word line read voltage generator 406 or the bit line read voltage generator 408) operates in multiple drive strength or current modes, the given read voltage generator may switch from a first mode to a second mode. The given read voltage generator may do so when, or after, a given associated voltage reaches or is set to a predetermined voltage level, or in response to the given associated voltage reaching, or being set to the predetermined voltage level.

In some example embodiments, including those described in further detail below, the sense controller 414 is configured to control the mode in which the given read voltage generator operates, such as by outputting one or more control signals, and the given read voltage generator configures itself in the particular mode indicated by the one or more control signals. In other example configurations, the given read voltage generator is configured to set itself in the different modes on its own without control of the sense controller 414.

In either of the embodiments, the sense controller 414 and/or the given read voltage generator may determine to switch from a first mode to a second mode according to any of various example configurations. In one example configuration, the sense controller 414 and/or the given read voltage generator may utilize a timer. When the sense controller 414 and/or the given read voltage generator determines that a time period, as implemented by the timer expires, the sense controller 414 and/or the given read voltage generator may determine that the associated voltage has reached, or is set to, the predetermined voltage level, and in response, switch the given read voltage generator from operating in a first mode to a second mode. Otherwise stated, the associated voltage may be considered to have reached or be set to the predetermined voltage level when the time period expires, irrespective of whether the associated voltage has actually reached or is set to the predetermined voltage level.

In another example embodiment, the sense controller 414 and/or the given read voltage generator is configured to measure the associated voltage and determine whether a measured voltage level of the associated voltage has satisfied a switching criteria associated with the predetermined voltage level. The switching criteria may be that the measured voltage level is equal to or has exceeded (either by moving above or moving below) a threshold level. The threshold level may be either the predetermined voltage level or a voltage level associated with the predetermined voltage level, such as a voltage level within a predetermined range around the predetermined voltage level. When the sense controller 414 and/or the given read voltage generator determines that the switching criteria has been satisfied, the sense controller 414 and/or the given read voltage generator may switch the given read voltage generator from operating in the first mode to the second mode. In either of the configurations, the given read voltage generator switching from a first mode to a second mode indicates that the associated voltage has reached or is set to the predetermined voltage level.

In addition, the given read voltage generator may be configured to generate the associated voltage and/or control the voltage level of the associated voltage differently in the different drive strength or current modes. For example, when the given read voltage generator switches from a first drive strength mode to a second drive strength mode, the given read voltage generator may have an increased or decreased (or reduced) drive strength level in the second drive strength mode compared to the drive strength level it has in the first drive strength mode. In this context, the given read voltage generator may have a changed drive strength level (e.g., an increased drive strength level or a decreased drive strength level) when it changes its drive strength mode.

In addition or alternatively, the given read voltage generator changes its drive strength, such as either to have an increased drive strength or a decreased drive strength, when it changes a level, amount, or value, such as by increasing or decreasing the level, amount, or value, of an attribute corresponding to and/or identifying its drive strength. For example, as described in further detail below, the drive strength level of the given read voltage generator may correspond and/or be proportional to the amount of current the given read voltage generator is configured to generate. Accordingly, the given read voltage generator may change its drive strength level, such as to an increased drive strength level or to a decreased drive strength level, by changing the amount of current it is generating from a first level to a second (increased or decreased) level. In some example configurations, the change in current from the first level to the second level may be on the order of microAmps or tens of microAmps, or more or less.

In addition or alternatively, for embodiments where the given read voltage generator operates in different current modes, and the different currents generated in the different current modes correspond to different drive strengths, the given read voltage generator may have a changed drive strength level, such as by having an increased drive strength level or a decreased drive strength level, when respectively operating in an increased or a decreased current mode of operation.

As described in further detail below, the given voltage generator may operate in different current modes of operation when different current branches are activated and deactivated. Accordingly, a given voltage generator, or current generator, may have a changed drive strength level, such as an increased or a decreased drive strength level, when it changes a configuration of activated and deactivated current branches to correspondingly change an amount of current generated with the branches. In some example configurations, the sense controller 414 may control the activation and deactivation of certain current branches through output of control signals. Accordingly, the given voltage generator may change its drive strength level, such as to an increased or decreased drive strength level, according to a change in levels of control signals corresponding to a change in configuring the current branches in activated and deactivated states. Such voltage drive strength may be characterized as more or less internal Thevinen resistance or current limit. Or a current generator may similarly vary in magnitude of the current forced with a voltage limit or compliance.

As shown in FIG. 4, each of the memory cells MC may be coupled to a respective one of a plurality of bit lines and a respective one of a plurality of word lines. In particular, each of the memory cells MC may include a first end or terminal coupled to a respective one of the plurality of bit lines and a second end or terminal coupled to a respective one of the plurality of word lines. For a given sense operation to read data from a selected memory cell MC(s), the other memory cells MC of the array 400 that are biased with voltages but are otherwise not the subject of the sense operation are referred to as unselected memory cells. Unselected memory cells are not the subject of the sense operation in that even though they are simultaneously biased with voltages at the time that the selected word line and bit line are biased with voltages, the read circuitry does not determine the logic values of data that the other, unselected memory cells MC may be storing at the time of the sense operation. As indicated in FIG. 4, for a given sense operation, the word line that is coupled to the selected memory cell MC(s) is referred to as a selected word line. The other word lines coupled to unselected memory cells MC are referred to as unselected word lines. In addition, the bit line that is coupled to the selected memory cell MC(s) is referred to as a selected bit line. The other bit lines coupled to unselected memory cells MC are referred to as unselected bit lines.

In order to perform a sense operation on the selected memory cell MC(s), the read circuitry may apply a read voltage difference at a predetermined read voltage difference level across the selected memory cell MC(s). How the selected memory cell MC(s) responds to the read voltage difference at the predetermined read voltage difference level—such as whether or how much cell current Icell the selected memory cell MC(s) draws in response to the read voltage difference at the predetermined read voltage difference level—may indicate the logic value of the data that the selected memory cell MC(s) is storing. In order to generate the read voltage difference, the read circuitry is configured to generate a selected word line voltage $V_{WL\_SEL}$ on the selected word line (or bias the selected word line with the selected word line voltage $V_{WL\_SEL}$), and generate a selected bit line voltage $V_{BL\_SEL}$ on the selected bit line (or bias the selected bit line with the selected bit line voltage $V_{BL\_SEL}$).

The predetermined read voltage difference level may be the difference between the selected word line voltage $V_{WL\_SEL}$ at a predetermined read selected word line voltage level $V_{WL\_RD}$ and the selected bit line voltage $V_{WB\_SEL}$ at a predetermined read selected bit line voltage level $V_{BL\_RD}$ configured for reading data stored in the selected memory cell MC(s). Depending on the configuration of the memory system 100 and/or the memory technology used for the memory cells MC, the read circuitry may be configured to generate one of the read selected word line voltage level $V_{W\_RD}$ and the read selected bit line voltage level $V_{BL\_RD}$ higher than the other in order generate the read voltage difference at the read voltage difference level with a predetermined polarity relative to the first and second terminals of the selected memory cell MC(s). In the example configurations described herein, the read selected word line voltage level $V_{WL\_RD}$ is higher than the read selected bit line voltage level $V_{BL\_RD}$. In other words, to perform a sense operation, the read circuitry is configured to generate a higher voltage on the selected word line compared to the voltage it generates on the selected bit line in order to read data from the selected memory cell MC(S). Other configurations may be possible, including those where the read selected bit line voltage level $V_{BL\_RD}$ is higher than the read selected word line voltage level $V_{WL\_RD}$.

The word line read voltage generator 406 is configured to generate a global selected word line voltage $V_{GWL\_SEL}$ at a global selected word line node GWL_SEL. Through generation and/or supply of the global word line current $I_{GWL}$, the word line read voltage generator 406 may be configured to drive the global selected word line node $G_{WL\_SEL}$ with or according to an associated drive strength to generate the global selected word line voltage $V_{GWL\_SEL}$. In general, a drive strength of an electronic circuit is a measure of the electronic circuit's ability to effect a change of a characteristic of a voltage, a current, or a signal. Non-limiting examples of a characteristic that can be changed by an electronic circuit include a voltage level or amount (such as an average voltage level or a peak voltage level), a current level or amount (such as an average current level or a peak current level), internal resistance if a voltage source, and voltage limit and magnitude if a current source, duty cycle, frequency, pulse width, amplitude, modulation, or signal-to-noise ratio. Other characteristics may be possible. The stronger a drive strength of the electronic circuit, the faster the electronic circuit can change the characteristic. For example, when changing the voltage on a line, such as a bit line or a word line from a unselected voltage level to a selected voltage level, the stronger a drive strength of the electronic circuit can change the voltage level on the line from an unselected voltage level to a selected voltage level with varying speed and ability to overcome leakage. In addition, reduced drive strength of the electronic circuit may slow the electronic circuit change. For example, when the electronic circuit is configured to change a voltage level on a line (e.g., a bit line or a word line) and leakage current is present on the line, weaker drive strength of the electronic circuit may slow or reduce the electronic circuit's ability to change the voltage level on the line from a selected level to an unselected level in the presence of the leakage current on the line.

With respect to the word line read voltage generator 406, the associated drive strength of the word line read voltage generator 406 is an indication or a measure of the word line read voltage generator's 406 ability to affect, influence, or change, such as by increasing or decreasing, a voltage level of the global selected word line voltage $V_{GWL\_SEL}$. For example, the greater the drive strength of the word line read voltage generator 406, the greater its ability to increase or decrease the voltage level of the global selected word line voltage $V_{GWL\_SEL}$ and/or the faster the rate at which the word line read voltage generator 406 can cause the voltage level of the global selected word line voltage $V_{GWL\_SEL}$ to increase or decrease.

For at least some example configurations, the word line read voltage generator 406 may be configured as a current supply that generates and supplies a global word line current $I_{GWL}$. To generate the global selected word line voltage $V_{GWL\_SEL}$, the word line read voltage generator 406, as a current supply, may be configured to generate a global word line current $I_{GWL}$ and supply the global word line current $I_{GWL}$ to the global selected word line node GWL_SEL. A voltage level of the global selected word line voltage $V_{GWL\_SEL}$ generated at the global selected word line node GWL_SEL may depend on an amount of the global word line current $I_{GWL}$ and its allowed voltage limit that the word line read voltage generator 406 supplies to the global selected word line node GWL_SEL.

For example configurations where the word line read voltage generator 406 is configured as a current supply, the drive strength of the word line read voltage generator 406 at a given point in time may correspond to, or depend on, a level or amount of the global word line current $I_{GWL}$ that the word line read voltage generator 406 is generating at that given point in time. The greater the amount or level of the global word line current $I_{GWL}$, the greater the drive strength of the word line read voltage generator 406, and the lower the amount or level of the global word line current $I_{GWL}$, the lower the drive strength of the word line read voltage generator 406.

As described in further detail below, for some example configurations of the read circuitry, the word line read voltage generator (or current supply) 406 may be configured to operate in multiple current modes, including a high current mode and a low current mode, during a sense operation. In the high current mode, the word line read voltage generator 406 may be configured to generate and/or supply the global word line current $I_{GWL}$ at a first, high current level or amount to increase or ramp up the global selected word line voltage $V_{GWL\_SEL}$ to the read selected word line voltage level $V_{WL\_RD}$. After or in response to the global selected word line voltage $V_{GWL\_SEL}$ reaching the read selected word line voltage level $V_{WL\_RD}$, the word line read voltage generator 406 may be configured to decrease the global word line current $I_{GWL}$ from the first current level to the a second, low current level or amount that is lower than the first current level. The word line read voltage generator 406 may be configured to supply the global word line current $I_{GWL}$ at the lower, second level to the global selected word line node GWL_SEL to continue generating the global selected word line voltage $V_{GWL\_SEL}$.

The word line read voltage generator 406 may generate the global word line current $I_{GWL}$ at the higher of the two levels in order to overcome leakage current pulling down the voltage level of the global selected word line voltage $V_{GWL\_SEL}$ and pull up the voltage level of global selected word line voltage $V_{GWL\_SEL}$ from a read unselected word line voltage level $V_{WLU}$ to the read selected word line voltage level $V_{WL\_RD}$ during a desired predetermined time period while not being too high to cause too high of a word line disturb due to capacitive coupling on neighboring word lines. When the global selected word line voltage $V_{GWL\_SEL}$ reaches the read selected word line voltage level $V_{WL\_RD}$, the word line read voltage generator 406 may switch to the low current mode and supply the global word line current $I_{GWL}$ at the second, low level in order to allow the global selected word line voltage $V_{GWL\_SEL}$ to decrease down to below a trip voltage level Vtp faster than if it kept supplying the global word line current $I_{GWL}$ at the first, high level, so as to arrive more quickly at that level when the selected memory cell MC(s) is in the low resistance state. Otherwise, if the selected memory cell MC(s) is in the higher resistance state, the selected memory cell MC(s) does not trigger on and the selected word line remains at or closer to the higher read selected word line voltage level $V_{WL\_RD}$ throughout the read cycle. Also, in some configurations, supplying the global word line current $I_{GWL}$ at the second, low level may help limit memory cell current Icell that the selected memory cell MC(s) is conducting if it turns on in the sense operation, which in turn may reduce the likelihood of false writes. Further details of these aspects are described in further detail below.

The word line decoder 402 is coupled to the global selected word line node GWL_SEL and configured to receive the global selected word line voltage $V_{GWL\_SEL}$ generated at the global selected word line node GWL_SEL. In addition, the word line decoder 402 may be coupled to a plurality of word lines that, in turn, are coupled to memory cells MC of the memory array 400. The word lines to which the word line decoder 402 is coupled to may represent at least a portion of a total number of word lines coupled to the memory cell structure 142 of a given memory 104, as shown in FIG. 2B. Also, the word line decoder 402 may be configured to receive a word line address WL_ADDR from the sense controller 414. The word line address WL_ADDR identifies the address of the selected word line for a given sense operation. In response to receipt of the word line address WL_ADDR, the word line decoder 402 may be configured to electrically connect one of the word lines to which it is coupled to the global selected word line node GWL_SEL, and in turn, supply the global selected word line voltage $V_{GWL\_SEL}$ to the word line it couples to the global selected word line node GWL_SEL. That word line is the selected word line for the sense operation. The other word lines coupled to the word line decoder 402 are driven so that the word line decoder 402 does not electrically connect them to the global selected word line node GWL_SEL in response to receipt of the word line address WL_ADDR, and they are the unselected word lines for the sense operation of this read cycle. During the sense operation, the word line decoder 402 may configured to bias the unselected word lines with associated word line voltages at predetermined read unselected word line voltage levels $V_{WLU}$.

The bit line read voltage generator 408 is configured to generate a global selected bit line voltage $V_{GBL\_SEL}$ at a global selected bit line node GBL_SEL. Similar to the word line read voltage generator 406, the bit line read voltage generator 408 may be configured to generate the global selected bit line voltage $V_{GBL\_SEL}$ with or according to an associated drive strength. The drive strength of the bit line read voltage generator 408 is an indication or a measure of the bit line read voltage generator's 408 ability to affect, influence, or change, such as by increasing or decreasing, a voltage level of the global selected bit line voltage $V_{GBL\_SEL}$. For example, the greater the drive strength of the bit line read voltage generator 408, the greater its ability to increase or decrease the voltage level of the global selected bit line voltage $V_{GBL\_SEL}$ and/or the faster the rate at which the bit line read voltage generator 408 can cause the voltage level of the global selected word line voltage $V_{GBL\_SEL}$ to increase or decrease.

For at least some example configurations, the bit line read voltage generator 408 may be configured as a current supply that generates and supplies a global bit line current $I_{GBL}$. To generate the global selected bit line voltage $V_{GBL\_SEL}$, the bit line read voltage generator 408, as a current supply, may be configured to generate a global bit line current $I_{GBL}$ and supply the global bit line current $I_{GBL}$ to the global selected bit line node GBL_SEL. A voltage level of the global selected bit line voltage $V_{GBL\_SEL}$ generated at the global selected bit line node GBL_SEL may depend on an amount of the global bit line current $I_{GBL}$ that the bit line read voltage generator 408 supplies to the global selected bit line node GBL_SEL.

For example configurations where the bit line read voltage generator 408 is configured as a current supply, the drive strength of the bit line read voltage generator 408 at a given point in time may correspond to or depend on a level or amount of the global bit line current $I_{GBL}$ that the bit line read voltage generator 408 is generating at the given point in time. The greater the amount or level of the global bit line current $I_{GBL}$, the greater the drive strength of the bit line read voltage generator 408, and the lower the amount or level of the global bit line current $I_{GBL}$, the lower the drive strength of the bit line read voltage generator 408.

As described in further detail below, for some example configurations of the read circuitry, the bit line read voltage generator (or current supply) 408 may be configured to operate in multiple drive strength modes or current modes, including a high drive strength or current mode, and a low drive strength or current mode, during a sense operation. In the high drive strength or current mode, the bit line read voltage generator 408 may be configured to drive the global selected bit line node GBL_SEL, and in turn, initially set the global selected bit line voltage $V_{GBL\_SEL}$ with or according to its drive strength at an initial, high drive strength level. To so do, the bit line read voltage generator 408, in the high drive strength or current mode, may be configured to generate and/or supply the global bit line current $I_{GBL}$ at a first, high current level. Initially setting the voltage level of the global selected bit line voltage $V_{GBL\_SEL}$ may include moving the voltage level of the global selected bit line voltage $V_{GBL\_SEL}$ from a read unselected bit line voltage level $V_{BLU}$ down to the read selected bit line voltage level $V_{BL\_RD}$. After or in response to the bit line read voltage generator 408 setting the global selected bit line voltage $V_{GBL}$ to the read selected bit line voltage level $V_{BL\_RD}$, with the initial high drive strength level, the bit line read voltage generator 408 may decrease its drive strength from the initial drive strength level to a reduced or decreased drive strength level. When decreasing the drive strength to the decreased drive strength level, the bit line read voltage generator 408 may continue to generate the global selected bit line voltage $V_{GBL}$ to the same given voltage level (i.e., the read selected bit line voltage level $V_{BL\_RD}$) as that used during the higher drive portion of the read cycle, but with higher internal resistance or a lower current limit if a current source. To do so, the bit line read voltage generator 408 may switch from the high drive strength or current mode to the low drive strength or current mode. In the low drive strength or current mode, the bit line read voltage generator 408 may be configured to generate and/or supply the global selected bit line current $I_{GBL}$ at a second, low current level. The bit line read voltage generator 408 may be configured to maintain the global selected bit line voltage $V_{GBL\_SEL}$ at the read selected bit line voltage level $V_{BL\_RD}$ at least until the turns on. In at least some example configurations, drive strength of the bit line read voltage generator 408 may exceed the drive strength of the word line read voltage generator 406 to assure that the selected word line is pulled down to below a pre-set, threshold level, should the selected memory cell MC(s) trigger on, to detect the data stored in the selected memory cell MC(s) as having a logic 1 value versus a logic 0 value.

As described in further detail below, in the event that the selected memory cell MC(s), the selected memory cell MC(s) may be configured to conduct a memory cell current Icell. When the selected memory cell MC(s) initially turns on, the memory cell current Icell that the selected memory cell MC(s) conducts may include a relatively short spiked portion followed by a decaying portion, in which the level of the memory cell current Icell decreases or decays from a peak level of the spiked portion towards a steady, decayed level. A current path through which the memory cell current Icell flows may include the bit line read voltage generator (or bit line current supply) 408. Accordingly, a level or amount of the memory cell current Icell when the memory cell current Icell peaks and decays, the rate at which the memory cell current Icell decays, and/or the steady decayed level may depend on the drive strength of the bit line read current generator 408 and/or the level of the global bit line current $I_{GBL}$ that the bit line read voltage generator 408 is generating while the selected memory cell MC(s) is conducting the spiked and decaying portions of the memory cell current Icell. In this context, the bit line read voltage generator 408 may be configured to control the memory cell current Icell when the selected memory cell MC(s) turns on, in that the level or amount of the memory cell current Icell when the memory cell current Icell peaks and decays, the rate at which the memory cell current Icell decays, and/or the steady decayed level may depend on the drive strength of the bit line read current generator 408 and/or the level of the global bit line current $I_{GBL}$ that the bit line read voltage generator 408 is generating.

By initially setting the global selected bit line voltage $V_{GBL\_SEL}$ to the read selected bit line voltage level $V_{BL\_RD}$ according to the high drive strength level and/or by supplying the global bit line current $I_{GBL}$ at the first, high level, the bit line read voltage generator 408 may be configured to decrease or drive down the voltage level of the global selected bit line voltage $V_{GBL\_SEL}$, and in turn the selected bit line voltage $V_{BL\_SEL}$, at a desirably fast rate. Conversely, if the bit line read voltage generator 408 were to drive down the voltage level of the global selected bit line voltage $V_{GBL\_SEL}$, and in turn the selected bit line voltage $V_{BL\_SEL}$, according to the low drive strength and/or with the global bit line current $I_{GBL}$ at the second, low current, the bit line read voltage generator 408 may be configured to decrease or drive down the voltage level of the global selected bit line voltage $V_{GBL\_SEL}$, and in turn the selected bit line voltage $V_{BL\_SEL}$, at an undesirably low rate. However, if the bit line read voltage generator 408 were to keep or maintain its drive strength at the high drive strength level and/or continue to generate the global bit line current $I_{GBL}$ at the high level, the bit line read voltage generator 408 may allow the selected memory cell MC(s) to conduct the memory cell current Icell at too high of levels during the spiked and decaying portions that yield a relatively high likelihood of causing false writes. Conversely, by switching to the low drive strength or current mode, the bit line read voltage generator 408 may control the level of the memory cell current Icell to a lower level compared to it would if operating in the high drive strength or current mode, thus reducing the likelihood of false writes occurring.

Such a configuration of switching between the high and low drive strength or current modes may be particularly advantageous for read circuitry configurations that include a clamp circuit, such as the clamp circuit 412 in the example configuration of FIG. 4. In the event that the selected memory cell MC(s) turns on, the voltage level of the selected word line voltage $V_{WL\_SEL}$ may rapidly drop or decrease, which in turn may trigger the clamp circuit 412, causing the clamp circuit 412 to clamp the selected word line voltage $V_{WL\_SEL}$ to a clamp voltage level. In the event that this occurs, the clamp circuit 412 may form part of the current path along with the selected memory cell MC(s) and the bit line read voltage generator (current supply) 408, which in turn may reduce or eliminate the ability of the word line read voltage generator (current supply) 406 to control the amount of the memory cell current Icell flowing through the selected memory cell MC(s) when it turns on. Accordingly, the bit line read voltage generator 406 may provide the current limiting of the memory cell current Icell to reduce the likelihood of false writes occurring during the sense operations. Details of these aspects are described in further detail below.

The bit line decoder 404 is coupled to the global selected bit line node GBL_SEL and configured to receive the global selected bit line voltage $V_{GBL\_SEL}$ generated at the global selected bit line node $G_{BL\_SEL}$. In addition, the bit line decoder 404 may be coupled to a plurality of bit lines that, in turn, are coupled to memory cells MC of the memory array 400. The bit lines to which the bit line decoder 404 is coupled to may represent at least a portion of a total number of bit lines coupled to the memory cell structure 142 of a given memory 104, as shown in FIG. 2B. Also, the bit line decoder 404 may be configured to receive a bit line address BL_ADDR, such as from the sense controller 414. The bit line address BL_ADDR identifies the address of the selected bit line for a given sense operation. In response to receipt of the bit line address BWL_ADDR, the bit line decoder 404 may be configured to electrically connect one of the bit lines to which it is coupled to the global selected bit line node GBL_SEL, and in turn, bias the global selected bit line voltage $V_{GBL\_SEL}$ to the bit line it couples to the global selected bit line node GBL_SEL. That bit line is the selected bit line for the sense operation. The other bit lines coupled to the bit line decoder 404 that bit line decoder 404 does not electrically connect to the global selected bit line node GBL_SEL in response to receipt of the bit line address BL_ADDR are the unselected bit lines for the sense operation. During the sense operation, the bit line decoder 404 may configured to bias the unselected bit lines with associated bit line voltages at predetermined read unselected bit line voltage levels $V_{BLU}$.

Figure 5:
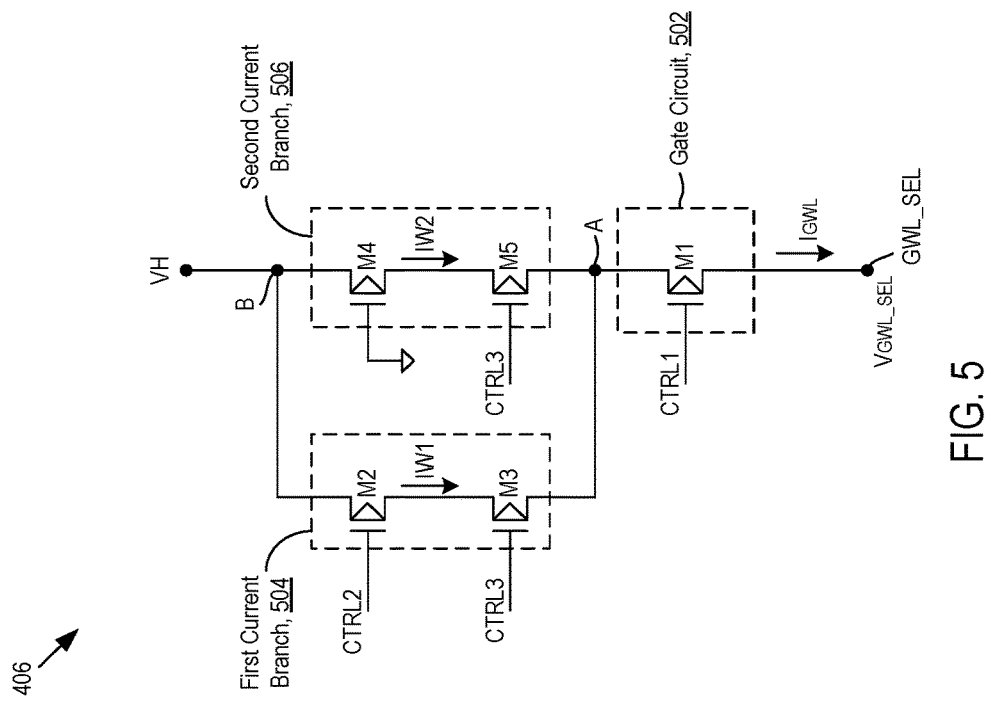
FIG. 5 is a circuit schematic diagram of an example configuration of a word line read voltage generator of the example read circuitry of FIG. 4.

FIG. 5 shows a circuit schematic diagram of an example circuit configuration of the word line read voltage generator 406. The word line read voltage generator 406 may be configured to be activated and deactivated. When activated, the word line read voltage generator 406 may be configured to generate or draw the global word line current $I_{GWL}$, such as by sourcing the global word line current $I_{GWL}$ to the global selected word line node GWL_SEL. When deactivated, the word line read voltage generator 406 may be prevented from generating or drawing the global word line current $I_{GWL}$.

In the example configuration of FIG. 5, the word line read voltage generator 406 may include a gate circuit 502 that is configured to activate and deactivate the word line read voltage generator 406. The gate circuit 502 itself may be configured to be activated and deactivated. When activated, the gate circuit 502 may be configured to activate the word line read voltage generator 406 to allow or enable the word line read voltage generator 406 to generate the global word line current $I_{GWL}$ and source the global word line current $I_{GWL}$ to the global selected word line node GWL_SEL. When deactivated, the gate circuit 502 may be configured to deactivate the word line read voltage generator 406 to prevent the word line read voltage generator 406 from drawing the global word line current $I_{GWL}$ and/or sourcing the global word line current $I_{GWL}$ to the global selected word line node GWL_SEL.

In the example configuration shown in FIG. 5, the gate circuit 502 may be configured as a first p-channel metal-oxide-semiconductor field-effect (PMOS) transistor M1. The first NMOS transistor M1 may have a drain terminal connected to the global selected word line node GWL_SEL and a source terminal connected to a node A. In addition, the first PMOS transistor M1 may be configured to receive, such as at its gate terminal, a first control signal CTRL1, such as from the sense controller 414, or alternatively as a voltage from the word line decoder 402, to turn on and turn off the first PMOS transistor M1, which may be in series with other decoder or control or timing signals. The sense controller 414 may output the first control signal CTRL1 at a first (low) level to turn on the first PMOS transistor M1, and in turn activate the word line read voltage generator 406, and output the first control signal CTRL1 at a second (high) level to turn off the first PMOS transistor M1, and in turn deactivate the word line read voltage generator 406.

When activated, and with the example configuration of FIG. 5, the word line read voltage generator 406 may be configured to operate in two current modes of operation, including a high drive strength or current mode and a low drive strength or current mode. In the high current mode, the word line read voltage generator 406 may be configured to generate the global word line current $I_{GWL}$ and source the global word line current $I_{GWL}$ to the global selected word line node GWL_SEL at a first, high current level or amount. In the low current mode, the word line read voltage generator 406 may be configured to generate the global word line current $I_{GWL}$ and source the global word line current $I_{GWL}$ to the global selected word line node GWL_SEL at a second, low current level or amount. The first current amount and the second current amount are both non-zero values, and when added with the first and second current amount being higher in magnitude than the second current amount.

For the example configuration shown in FIG. 5, the word line read voltage generator 406 may include a plurality of current branches connected in parallel with each other, including a first current branch 504 and a second current branch 506. The first and second current branches 504, 506 each include a first end connected to node A and a second end connected to a node B where the voltage supply circuitry (or a voltage source external to the memory die 104) is configured to supply a first (high) supply voltage VH and/or bias the second ends of the current branches 504, 506 for performance of a sense operation.

The first current branch 504 may be configured to be activated and deactivated. When activated, the first current branch 504 may be configured to generate or draw a first branch current IW1 at a first associated branch current level or amount. When deactivated, the first current branch 504 may draw no or substantially no current. Otherwise stated, the first branch current IW1 that the first current branch 504 draws when deactivated is at or substantially zero. Similarly, the second current branch 506 may be configured to be activated and deactivated, such as depending on a voltage level (logic state) of a third control signal CNTRL3. When activated, the second current branch 506 may be configured to generate or draw a second branch current IW2 at a second associated branch current level or amount. When deactivated, the second current branch 506 may draw no or substantially no current. Otherwise stated, the second branch current IW2 that the second current branch 506 draws when deactivated is at or substantially zero. In any of various example configurations, the first branch current level or amount may be the same as, higher, or lower than the second branch current level or amount.

In combination, the first and second current branches 504, 506 may determine the amount of the global word line current $I_{GWL}$ that the word line read voltage generator 406 generates and sources to the global selected word line node GWL_SEL. The amount of the global word line current $I_{GWL}$ may depend on whether the first and second branches 504, 506 are activated or deactivated. When both the first and second branches 504, 506 are activated, an amount of the global word line current $I_{GWL}$ is the sum of the associated amount of the first branch current IW1 and the associated amount of the second branch current IW2. When the first branch 504 is activated and the second branch 506 is deactivated, the amount of the global word line current $I_{GWL}$ is equal to the amount of the first branch current IW1. When the first branch 504 is deactivated and the second branch 506 is activated, the amount of the global word line current $I_{GWL}$ is equal to the amount of the second branch current IW2. When both branches 504, 506 are deactivated, the amount of the global word line current $I_{GWL}$ is zero or substantially zero. In the event that the third control signal CTRL3 is eliminated by a short in either the first current branch 504, the second current branch 506, or both, the global word line current $I_{GWL}$ is determined by a fourth PMOS transistor M4 and a second PMOS transistor M2, where the second PMOS transistor M2 may be on or off as determined by a voltage level from a second control signal CTRL2 that corresponds to a logic state that causes the second PMOS transistor M2 to be in the on state or the off state.

For the example configuration of FIG. 5, when the word line read voltage generator 406 operates in the high current mode, the word line read voltage generator 406 may activate both the first current branch 504 and the second current branch 506 in order to generate the global word line current $I_{GWL}$ at the first, high current level. When the word line read voltage generator 406 is to switch from operating in the high current mode to operating in the low current mode, the word line read voltage generator 406 may deactivate the first current branch 504 and keep the second current branch 506 activated to decrease the amount or level of the global word line current $I_{GWL}$ from the high current level to the low current level.

Each of the first and second branches 504, 506 may be configured in any of various ways to be activated and deactivated. In the example shown in FIG. 5, each of the branches includes a pair of series-connected PMOS transistors. For a given branch including a given pair of series-connected PMOS transistors, when both PMOS transistors of the given branch are turned on, the given branch is activated and configured to conduct or draw its associated current. When one or both of the PMOS transistors is/are turned off, the give branch is deactivated and configured to not draw any current.

In further detail, the first branch 504 may include a second PMOS transistor M2 connected in series with a third PMOS transistor M3. The second PMOS transistor M2 may have a source terminal connected to node B and drain terminal connected to a source terminal of the third PMOS transistor M3. The third PMOS transistor M3 may have a drain terminal connected to node A. In addition, the second PMOS transistor M2 may be configured to receive, such as at its gate terminal, a second control signal CTRL2, such as from the sense controller 414. The sense controller 414 may output the second control signal CTRL2 at a first level (e.g., a low level) to turn on the second PMOS transistor M2 and at a second level (e.g., a high level) to turn off the second PMOS transistor M2. Additionally, the third PMOS transistor M3 may be configured to receive, such as at its gate terminal, a third control signal CTRL3, such as from the sense controller 414. The sense controller 414 may output the third control signal CTRL3 at a first level (e.g., a low level) to turn on the third PMOS transistor M3 and at a second level (e.g., a high level) to turn off the third PMOS transistor M3.

In addition, the second branch 506 may include a fourth PMOS transistor M4 connected in series with a fifth PMOS transistor M5. The fourth PMOS transistor M4 may have a source terminal connected to node B and a drain terminal connected to a source terminal of the fifth PMOS transistor M5. The fifth PMOS transistor M5 may have a drain terminal connected to node A. In addition, the fourth PMOS transistor M4 has its gate terminal biased to a low voltage (e.g., a ground reference voltage), such that the voltage difference between the level of the first supply voltage VH and the level of the low voltage is sufficient to always turn on the fourth PMOS transistor M4. This way, whether the second branch 506 is activated or deactivated depends on the fifth PMOS transistor M5 without also having to independently control the fourth PMOS transistor M4. Also, the fifth PMOS transistor M5 may be configured to receive, such as at its gate terminal, the third control signal CTRL3. Accordingly, in the example configuration shown in FIG. 5, the third and fifth PMOS transistors M3, M5 may be turned on or turned off at the same time or during the same time periods.

Accordingly, when the sense controller 414 wants the word line read voltage generator 406 to supply the global word line current $I_{GWL}$ to the global selected word line node BWL_SEL, the sense controller 414 may control an amount of the global word line current $I_{GWL}$ and/or whether the word line read voltage generator 406 operates in the high current mode or the low current mode through output of the second and third control signals CTRL2, CTRL3. When the sense controller 414 wants the word line read voltage generator 406 to operate in the high current mode, the sense controller 414 may output the second and third control signals CTRL2, CTRL3 so that both current branches 504, 506 are activated. In response, the first and second current branches 504, 506, in combination, may source the global word line current $I_{GWL}$ at an amount equal to the sum of the amount of the first branch current IW1 and the second branch current IW2 to node A. The sum of the amount of the first branch current IW1 and the amount of the second branch current IW2 may be the first, high level or amount of the global word line current $I_{GWL}$ that the word line read voltage generator 406 generates in the high current mode. In turn, the gate circuit 502, turned on, may supply the global word line current $I_{GWL}$ at the first, high current amount to the global selected word line node GWL_SEL.

When the sense controller 414 wants the word line read generator voltage 406 to operate in the low current mode, the sense controller 414 may output the second and third control signals CTRL2, CTRL3 so that the first current branch 504 is deactivated and the second current branch 506 is activated. In response, the amount of current sourced to node A may be the amount of the second branch current IW2 and not the first branch current IW1. The amount of the second branch current IW2 may be the second, low level or amount of the global word line current $I_{GWL}$. In turn, the gate circuit 502, turned on, may supply the global word line current $I_{GWL}$ at the second, low current amount to the global selected word line node GWL_SEL.

The word line read voltage generator 406 may have configurations other than the example configuration shown in FIG. 5. For example, in other example configurations, the word line read voltage supply generator 406 may be configured to operate in a single current mode. For such other example configurations, the word line read voltage generator 406 may be configured to generate a current at only a single amount to the global selected word line node GWL_SEL, configurable in only a single mode of operation, and/or have only a single current branch.

Figure 6:
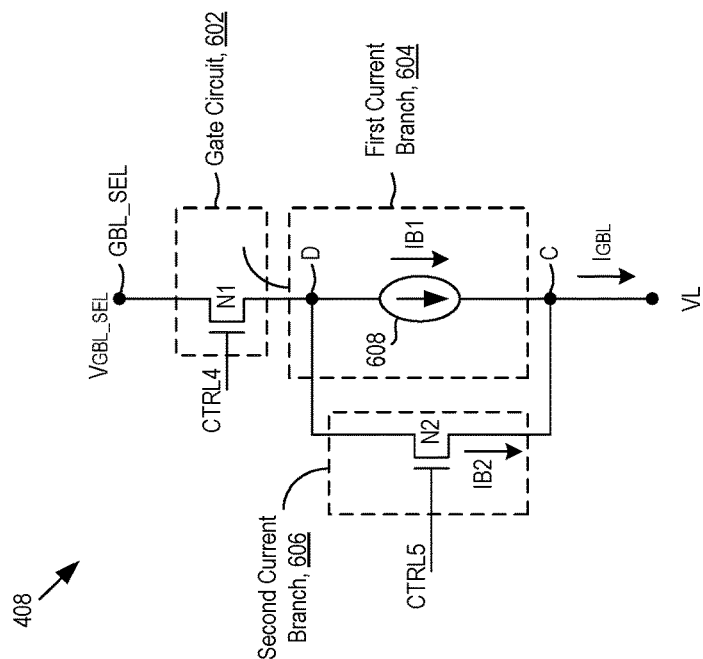
FIG. 6 is a circuit schematic diagram of an example configuration of a bit line read voltage generator of the example read circuitry of FIG. 4.

FIG. 6 shows a circuit schematic diagram of an example configuration of the bit line read voltage generator 408. The bit line read voltage generator 408 may be configured to be activated and deactivated. When activated, the bit line read voltage generator 408 may be configured to draw a global bit line current $I_{GBL}$, such as by sinking the global bit line current $I_{GBL}$ from the global selected bit line node GBL_SEL to a node C that is configured to receive and/or be biased to a second (low) voltage VL. When deactivated, the bit line read voltage generator 408 may be prevented from drawing current from the global selected bit line node GBL_SEL to the node C.

In the example configuration of FIG. 6, the bit line read voltage generator 408 may include a gate circuit 602 that is configured to activate and deactivate the bit line read voltage generator 408. The gate circuit 602 itself may be configured to be activated and deactivated, and in some example configurations, a fourth control signal CTRL4 used to activate and deactivate the gate circuit 602 can come from the bit line decoder 404 to select the bit line to which the selected bit line voltage $V_{BL\_SEL}$ is applied. When activated, the gate circuit 602 may be configured to activate the bit line read voltage generator 408 to allow the bit line read voltage generator 408 to draw the global bit line current $I_{GBL}$. When deactivated, the gate circuit 602 may be configured to deactivate the bit line read voltage generator 408 to prevent the bit line read voltage generator 408 from drawing current.

In the example configuration shown in FIG. 6, the gate circuit 602 may be configured as a first n-channel metal-oxide-semiconductor field-effect (NMOS) transistor N1. The first NMOS transistor N1 may have a drain terminal connected to the global selected bit line node GBL_SEL and a source terminal connected to a node D. In addition, the first NMOS transistor N1 may be configured to receive, such as at its gate terminal, a fourth control signal CTRL4, such as from the sense controller 414 to turn on and turn off the first NMOS transistor N1. The sense controller 414 may output the fourth control signal CTRL4 at a first (high) level to turn on the first NMOS transistor N1, and in turn activate the bit line read voltage generator 408, and output the fourth control signal CTRL4 at a second (low) level to turn off the first NMOS transistor N1, and in turn deactivate the bit line read voltage generator 408.

When activated, and with the example configuration of FIG. 6, the bit line read voltage generator 408 may be configured to operate in two drive strength or current modes of operation, including a high drive strength or current mode and a low drive strength or current low. In the high drive strength or current mode, the bit line read voltage generator 408 may be configured to generate the global bit line current $I_{GBL}$ and sink the global bit line current $I_{GBL}$ from the global selected bit line node GBL_SEL at a first, high current level or amount. In the low current mode, the bit line read voltage generator 408 may be configured to generate the global bit line current $I_{GBL}$ and sink the global bit line current $I_{GBL}$ from the global selected bit line node GBL_SEL at a second, low current level or amount. The first current amount and the second current amount are both non-zero values, with the first current amount being higher in magnitude than the second current amount.

For the example configuration shown in FIG. 6, the bit line read voltage generator 408 may include a plurality of current branches connected in parallel with each other, including a first current branch 604 and a second current branch 606. The first and second current branches 604, 606 each include a first end connected to node C and a second end connected to node D.

The first current branch 604 may include a current source 608 that is configured to generate a first branch current IB1 at a first associated current amount. In some example configurations, the current source 608 is controllable and/or adjustable such that amount of the first branch current D31 may vary. For example, the sense controller 414 may be configured to control, set, and/or adjust the current amount or level of the second current IB1.

The second current branch 606 may be configured to be activated and deactivated. When activated, the second current branch 606 may be configured to draw a second current IB1 at a second associated current amount. When deactivated, the second current branch 606 may draw no or substantially no current. Otherwise stated, the second current D32 that the second current branch 606 draws when deactivated is at or substantially zero.

In some example configurations as shown in FIG. 6, the second current branch 606 may include a second NMOS transistor N2. When the second NMOS transistor N2 is turned on, the second current branch 606 is activated, and when the second NMOS transistor N2 is turned off, the second current branch 606 is deactivated. The second NMOS transistor N2 may have a drain terminal connected to node D and a source terminal connected to node C. In addition, the second NMOS transistor N2 may be configured to receive, such as at its gate terminal, a fifth control signal CTRL5. The sense controller 414 may be configured to output the fifth control signal CTRL5 at a first (high) level to turn on the second NMOS transistor N2, and in turn the second current branch 606. In addition, the sense controller 414 may be configured to output the fifth control signal CTRL5 at a second (low) level to turn off the second NMOS transistor N2, and in turn the second current branch 606. In some example configurations, the sense controller 414 is configured to output the fifth control signal CTRL5 at the first level to cause the second NMOS transistor N2 to be fully turned on, or otherwise be configured to generate a maximum amount of current or maximum range of currents. The second NMOS transistor N2 and the current source 608 may be sized to provide more or less drive (e.g., a higher or lower drive strength), as appropriate for the speed and leakage requirement. For example, the second NMOS transistor N2 may be 10/.4 u transistor and the current source 608 may be 30 ua for a 1K×2K tile. With respect to the example configuration of the word line read voltage generator 406 of FIG. 5, for a 20 nm PCM memory element, one or both of the second and third PMOS transistors M2, M3 generating the first branch current IW1 in the first current branch 504 may be set at 12 ua and one or both of the fourth and fifth PMOS transistors M4, M5 of the second current branch 506 generating the second branch current IW2 may be set at 8 ua for a PCM memory cell that programs to higher resistance state at 100 ua and to the lower resistance state at 50 ua using a slow trailing edge greater than 100 ns. These branch currents IW1, IW2 may be adjusted proportionately for a memory element programming at higher or lower currents and for leakage levels that may be more or less, and for larger or smaller tile sizes (more or less than 1K×2K bits respectively on the word line and bit line).

The first current branch 604 may be configured to set, such as initially set, the global selected bit line voltage $V_{GBL\_SEL}$ to the read selected bit line voltage level $V_{BL\_RD}$ according to a drive strength at an initial, high drive strength level. The first current branch 604 may be configured to initially set the global selected bit line voltage $V_{GBL\_SEL}$, and in turn the selected bit line voltage $V_{BL\_SEL}$, to the read selected bit line voltage level $V_{BL\_RD}$ by decreasing the global selected bit line voltage $V_{GBL\_SEL}$ from the read unselected bit line voltage level $V_{BLU}$ to the read selected bit line voltage level $V_{BL\_RD}$. To do so, the sense controller 414 may activate the first current branch 604. In addition, the second current branch 606 may be configured to maintain or keep the global selected bit line voltage $V_{GBL\_SEL}$, and in turn the selected bit line voltage $V_{BL\_SEL}$ at the read selected bit line voltage level $V_{BL\_RD}$ according to the drive strength at the decreased drive strength level at least until the selected memory cell MC(s) activates or turns on during the sense operation. To do so, when or in response to initially setting the global selected bit line voltage $V_{GBL\_SEL}$ to the read selected bit line voltage level $V_{BL\_RD}$, the bit line read voltage generator 408 may switch from operating in the high drive strength or current mode to the low drive strength or current mode. In turn, the bit line read voltage generator 408 may switch from generating and/or supplying the global bit line current $I_{GBL}$ at the high current level to generating and/or supplying the global bit line current $I_{GBL}$ at the low current level.

The second current branch 606 may be configured to draw a larger amount of the second branch current IB2 than the amount of the first branch current D31 that the first current branch 604 is configured to draw. In this context, the current source 608 functions as a current limiter in that it limits the amount of the global bit line current $I_{GBL}$ that the bit line read voltage generator 408 can draw or sink from the global selected bit line node GBL_SEL compared to the amount of global bit line current $I_{GBL}$ that the second branch 606 (e.g., the fully turned-on NMOS transistor N2) will allow the bit line read voltage generator 408 to draw. On the other hand, the second current branch 606 and/or the second NMOS transistor N2 functions as a bypass circuit that allows current at a higher amount to flow from node D through the second current branch 606 and around the first current branch 604 to node C.

Accordingly, when the sense controller 414 wants the bit line read voltage generator 408 to operate in the high current mode, the sense controller 414 may output the fifth control signal CTRL5 to activate the second current branch 606 (turn on the second NMOS transistor N2) so that the bit line read voltage generator 408 draws the global bit line current $I_{GBL}$ at the high current amount of the second current IB2. In addition, when the sense controller 414 wants the bit line read voltage generator 408 to operate in the low current mode, the sense controller 414 may output the fifth control signal CTRL5 to deactivate the second current branch 606 (turn off the second NMOS transistor N2) so that the bit line read voltage generator 408 draws the global bit line current $I_{GBL}$ at the low current amount, as controlled or set or by the first branch 604 and/or the current source 608.

Configurations for the bit line read voltage generator 408 other than the one shown in FIG. 6 may be possible. For example, in other example configurations, the bit line read voltage supply generator 408 may be configured to operate in a single current mode. For such other example configurations, the bit line read voltage generator 408 may be configured to generate or draw a global bit line current $I_{GBL}$ at only a single amount and/or include only a single current branch. The single current branch may be configured like the second branch 606, where a transistor of the single current branch is controlled by a control signal that either completely turns on or completely turns off the transistor. Such configurations may not have an additional current branch, such as the first branch 604, that can limit the amount of the global bit line current $I_{GBL}$ to a lower, non-zero level, that is less than the amount drawn through the fully turned-on transistor.

Figure 7:
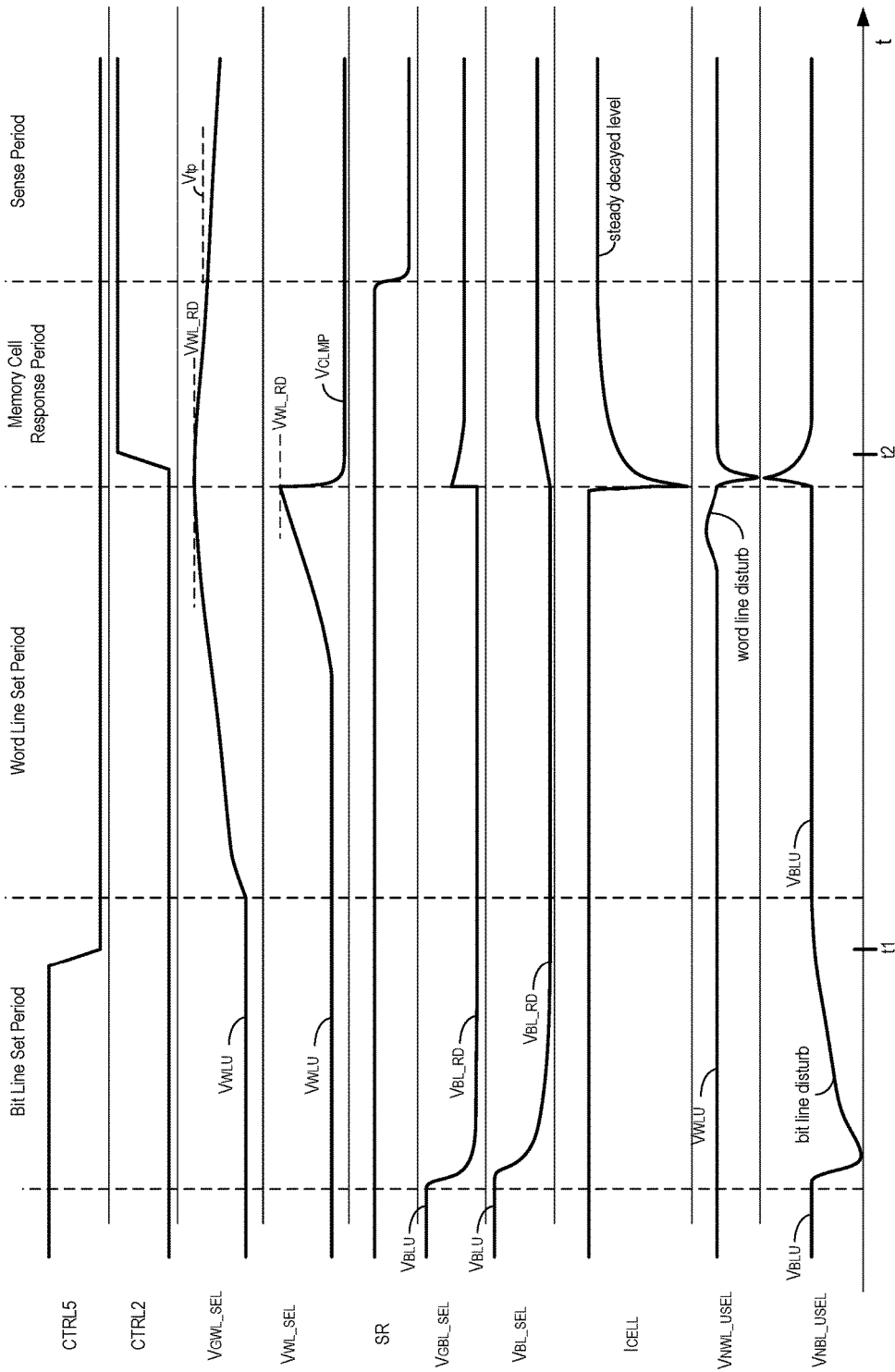
FIG. 7 is a timing diagram of signals, voltages, and currents generated with the read circuitry of FIG. 4 during an example sense operation.

An example sense operation to read data from the selected memory cell MC(s) is now described with reference to FIG. 4-7. FIG. 7 shows a timing diagram of certain signals and voltages generated with the example read circuitry of FIG. 4 during the example sense operation. The timing diagram further shows the cell current Icell as a function of time during the course of the sense operation. The waveform of the cell current Icell shown in FIG. 7 may be indicative of the cell current Icell that the selected memory cell MC(s) may draw when it is programmed in a state that causes the selected memory cell to conduct the cell current Icell at a magnitude level greater than zero or greater than leakage current biased with the read voltage difference at the predetermined read voltage difference level. Example memory technology may be PCM or ReRAM or other similar two-terminal and/or resistive memory technology, where the memory element of the memory cell is programmed in the low resistance state such that when the predetermined read voltage difference level exceeds the total threshold voltage of the memory element and the select element, selected memory cell MC(s) responds by conducting the memory cell current Icell at a magnitude value greater than zero or greater than a maximum leakage current level.

As described in further detail below, during the example sense operation, the word line read voltage generator 406 and/or the bit line read voltage generator 408 may provide current control to reduce the time of the sense operation, minimize undesirable effects of leakage current, minimize the likelihood of false selects, and/or minimize the likelihood of false writes. The word line read voltage generator 406 and the bit line read voltage generator 408 may each be configured to control current by each being configured to operate in their respective high and low current modes. In some example configurations and/or during some example sense operations, the word line read voltage generator 406 may be configured to operate in two current modes (i.e., both the high and low current modes), such as by having the example configuration of FIG. 5, while the bit line read voltage generator 408 may be configured to operate in a single current mode and thus not provide the current control that a configuration capable of operating in the two current modes may provide. In other example configurations and/or during other example sense operations, the bit line read voltage generator 408 may be configured to operate in two current modes, such as by having the example configuration of FIG. 6, while the word line read voltage generator 406 may be configured to operate in a single current mode. In still other example configurations and/or in still other example sense operations, both the word line voltage generator 406 and the bit line voltage generator 408 are configured to operate in two current modes, and thus both generators 406, 408 may provide current control through their respective two current modes of operation.

With reference to FIG. 7, the example sense operation is described as being performed over four periods, including a bit line set period, a word line set period, a memory cell response period, and a sense period. Other ways of separating an example sense operation into periods may be possible.

At the start of the sense operation (prior to the start of the bit line set period), the bit line decoder 404 sets the bit lines involved or associated with the sense operation to the predetermined unselected bit line level $V_{BLU}$, and the word line decoder 402 sets the word lines involved or associated with the sense operation to the predetermined unselected word line level $V_{WLU}$. In addition, prior to the start of the bit line set period, the sense controller 414 may output the bit line address BL_ADDR to the bit line decoder 404. In response, the bit line decoder 404 may electrically connect the global selected bit line node GBL_SEL to the selected bit line.

In the bit line set period, the bit line decoder 404 sets or initially sets the selected bit line voltage $V_{BL\_SEL}$ of the selected bit line to the predetermined read selected bit line voltage level $V_{BL\_RD}$. To do so, at the start or in an initial portion of the bit line set period, the bit line read voltage generator 408 may activate and begin generating the global bit line current $I_{GBL}$, which may include sinking the global bit line current $I_{GBL}$ from the global selected bit line node GBL_SEL, and which in turn may cause the voltage level of the global selected bit line voltage $V_{GBL\_SEL}$ to decrease from the read unselected bit line voltage level $V_{BLU}$ to the read selected bit line voltage level $V_{BL\_RD}$. Since the bit line decoder 404 electrically connected the global selected bit line node GBL_SEL to the selected bit line, the selected bit line voltage $V_{BL\_SEL}$ may follow the global selected bit line voltage $V_{GBL\_SEL}$ and decrease from the read unselected bit line voltage level $V_{BLU}$ to the read selected bit line voltage level $V_{BL\_RD}$, with some delay.

For example configurations and/or example sense operations where the bit line read voltage generator 408 is configured to operate in two current modes, the bit line read voltage generator 408 may be set in the high drive strength or current mode so that it draws the global bit line current $I_{GBL}$ at the higher of two current amounts, which in turn drives down the voltage level of the global selected bit line voltage $V_{GBL\_SEL}$ to the read selected bit line voltage level $V_{BL\_RD}$ as fast as it can, or at least faster than it would if it generated the global bit line current $I_{GBL}$ at the lower current amount or at the decreased drive strength level. For example, where the bit line read voltage generator 408 has the configuration of FIG. 6, at the start or in an initial period of the bit line set period, the sense controller 414 may output the fifth control signal CTRL5 to activate the sense current branch 606, such as by turning on the second NMOS transistor N2, to cause the bit line read voltage generator 408 to draw the global bit line current $I_{GBL}$ at the high current amount instead of the low current amount.

Additionally, for example configurations where the bit line read voltage generator 408 is configured to operate in the high and low current modes, at some point during the sense operation after the voltage level of the selected bit line voltage $V_{GBL\_SEL}$ reaches the read selected bit line voltage level $V_{BL\_RD}$, the bit line read voltage generator 408 may switch to operating in the low current mode so that the bit line read voltage generator 408 is drawing the global bit line current $I_{GBL}$ at the low current amount instead of the high current amount. For example, where the bit line read voltage generator 408 has the configuration of FIG. 6, the sense controller 414 may transition from outputting the fifth control signal CTRL5 at an associated high level to an associated low level to deactivate the second current branch 606. In response, the bit line read voltage generator 408 may begin drawing the global bit line current $I_{GBL}$ at the low amount as set by the current source 608. In FIG. 7, the fifth control signal CTRL5 is shown as transitioning from the high level to the low level to deactivate the second current branch 606 at a time t1 in the bit line sense period. In general, however, the bit line read voltage generator 408 may switch from generating the global bit line current $I_{GBL}$ at the high current amount to the low current amount at any time in between a time when the selected bit line voltage $V_{GBL\_SEL}$ reaches the read selected bit line voltage level $V_{BL\_RD}$ to a time before the selected memory cell MC(s) turns on and begins drawing the cell current Icell in response to the read voltage difference at the predetermined read voltage difference level.

When the bit line read voltage generator 408 switches from operating in the high drive strength or current mode to the low drive strength or current mode, the bit line read voltage generator 408 may be configured to keep or maintain the global selected bit line voltage $V_{GBL\_SEL}$, and in turn the selected bit line voltage $V_{BL\_SEL}$, at the read selected bit line voltage level $V_{BL\_RD}$ at least for a remaining portion of the bit line set period and during the word line set period. As described in further detail below, by switching from the high current mode to the low current mode, the bit line read voltage generator 408 may control the amount of the memory cell current Icell by limiting the amount of the cell current Icell flowing through the selected memory cell MC(s) during the memory cell response period, which in turn may prevent or at least reduce the likelihood of the selected memory cell MC(s) from being subjected to a false write.

In addition, during an example sense operation, at least one of the bit lines associated with and/or involved in the sense operation may be a neighboring bit line that experiences a bit line disturb during the sense operation. A bit line disturb is an event where a change of a first bit line voltage generated on a first bit line causes a change in voltage level of a second bit line voltage generated on a second bit line. A bit line disturb may be experienced by a neighboring bit line of the bit line being subjected to the voltage change. The bit line disturb may be caused by coupling capacitance between the selected bit line subjected to the voltage change and the unselected neighboring bit line. Herein, a second bit line is a neighboring bit line to a first bit line where the second bit line is physically close enough to the first bit line such that a change in voltage level of a first bit line voltage generated on the first bit line causes a change in voltage level of a second bit line voltage generated on the second bit line. A neighboring bit line may be a bit line that is physically adjacent to the bit line subjected to the voltage change, although a neighboring bit line may not be limited to only physically adjacent bit lines. The bit line may be selected first and its coupling into the neighbor abated by its holddown transistor to the unselected level, such as VMID=Vwrite/2, before the word line is moved in the selected direction. The speed of the selected line rise time can be adjusted to be 20 ns, more or less, by adjusting the global word line current current through the gate circuit 502 so that the coupling into the neighboring word line plus the voltage difference between the selected bit line and the unselect voltage is less than the threshold voltage Vt(OTs) of the selected memory cell MC(s) to avoid a false select.

FIG. 4 shows an unselected neighboring bit line voltage $V_{NBL\_USEL}$ generated on unselected neighboring bit line that is a neighbor to the selected bit line. FIG. 7 shows a waveform of the unselected neighboring bit line voltage $V_{NBL\_USEL}$ of the neighboring unselected bit line. As shown in FIG. 7, in the bit line set period, when the bit line read voltage generator 408 drives down the selected bit line voltage $V_{GBL\_SEL}$ to the read selected bit line voltage level $V_{BL\_RD}$, the voltage change may cause a bit line disturb on the unselected neighboring bit line, causing the unselected neighboring bit line voltage $V_{NBL\_USEL}$ to correspondingly decrease from the read unselected bit line voltage level $V_{BLU}$. After reaching a minimum voltage level, the unselected neighboring bit line voltage $V_{NBL\_USEL}$ may increase back up to the read unselected bit line voltage level $V_{BLU}$.

During a period of time that the unselected neighboring bit line voltage $V_{NBL\_USEL}$ decreased from the read unselected bit line voltage level $V_{BLU}$, the unselected neighboring bit line voltage $V_{NBL\_USEL}$ may be sufficiently close to the read selected bit line voltage level $V_{BL\_RD}$ such that in the event that the selected word line voltage $V_{WL\_SEL}$ began increasing above a read unselected word line voltage level $V_{WL\_USEL}$, a voltage difference between the unselected word line voltage $V_{WLU}$ and the selected bit line voltage $V_{BL\_SEL}$ could turn on a memory cell MC other than the selected memory cell MC(s) during the given sense operation, resulting in a false select. Herein, a false select is an event that can undesirably occur during a sense operation when a voltage difference between voltages generated on a selected bit line and an unselected word line, on an unselected bit line and a selected word line, or on an unselected bit line and an unselected word line turn on an unselected memory cell MC other than the selected memory cell MC(s). Turning on an unselected memory cell MC may cause the sense circuit 410 to identify the wrong logic value of data stored in the selected memory cell MC(s). Thus, it may be desirable to keep the selected word line voltage $V_{WL\_SEL}$ at the read unselected word line level $V_{WLU}$ and not increase it to the read selected word line voltage level $V_{WL\_RD}$ until after the bit line disturb has ended or substantially ended, and the voltage of the unselected neighboring bit line voltage $V_{NBL\_USEL}$ has increased back close enough to the read unselected bit line voltage level $V_{BLU}$ so that the risk of a false select is minimal.

As shown in FIG. 7, when the unselected neighboring bit line voltage $V_{NBL\_USEL}$ has increased back up to or at lease close to the read unselected word line level $V_{BLU}$, the bit line period may end and the word line set period may begin. At some point prior to the word line select period, the sense controller 414 may output the word line address WL_ADDR to the word line decoder 402. In response, the word line decoder 402 may electrically connect the global selected word line node GWL_SEL to the selected word line.

In the word line set period, the word line decoder 402 sets the selected word line voltage $V_{WL\_SEL}$ of the selected word line to the predetermined read selected word line voltage level $V_{WL\_RD}$. To do so, at the start of the word line set period, the word line read voltage generator 406 may activate and begin generating the global word line current $I_{GWL}$, which may include source the global word line current $I_{GWL}$ to the global selected word line node GWL_SEL, and which in turn may cause the voltage level of the global selected word line voltage $V_{GWL\_SEL}$ to increase from the read unselected word line voltage level $V_{WLU}$ to the read selected word line voltage level $V_{WL\_RD}$. Since the word line decoder 402 electrically connected the global selected word line node GWL_SEL to the selected word line, the selected word line voltage $V_{WL\_SEL}$ may follow the global selected word line voltage $V_{GWL\_SEL}$ and, after some delay, increase or ramp up from the read unselected word line voltage level $V_{WLU}$ to the read selected word line voltage level $V_{WL\_RD}$.

For example configurations and/or example sense operations where the word line read voltage generator 406 is configured to operate in two current modes, the word line read voltage generator 406 may be set in the high current mode so that it draws the global word line current $I_{GWL}$ at the higher of two current amounts, which in turn increases or ramps up the voltage level of the global selected word line voltage $V_{GWL\_SEL}$ to the read selected word line voltage level $V_{WL\_RD}$ faster than it would if it generated the global word line current $I_{GWL}$ at the lower current amount. For example, where the word line read voltage generator 406 has the configuration of FIG. 5, at the start of the word line set period, the sense controller 414 may output the second control signal CTRL2 to activate the first current branch 504, such as by turning on the second PMOS transistor M2, to cause the word line read voltage generator 406 to draw the global word line current $I_{GWL}$ at the high current amount (i.e., the sum of the current amounts drawn through the first and second current branches 504, 506) instead of the low current amount (only the amount of the second current IW2). The second control signal CTRL2 may be set to a level to turn off the second PMOS transistor M2 after the selected word line could have reached a threshold level relative to the final read selected word line voltage level $V_{WL\_RD}$ (Vfinal) such as about 98% of $V_{WL\_RD}$ or whatever is needed for adequate margin. Until then, the second control signal CTRL2 may be set to a level that configures the second PMOS transistor M2 in the "on" state to flow more select current into the selected word line. After reaching a reasonable Vfinal, the same signal or one in that time frame that switches the second control signal CTRL2 to a level to turn off the second PMOS transistor M2 could also open the data latch and change its state if the selected word line pulls low due to triggering on the selected memory cell MC(s) because it is programmed in the low resistance state.

In addition, during the word line set period, leakage current may flow in an array leak-in direction—i.e., in a direction toward the memory array 400—from the global selected word line node GWL_SEL into the word line decoder 402 and into the selected word line. The high amount of the global word line current $I_{GWL}$ that the word line read voltage generator 406 sources to the global selected word line node GWL_SEL may be sufficiently greater than the leakage current such that the difference between the amount of the global word line current $I_{GWL}$ and the amount of the leakage current, in combination with an effective capacitance provided by the global selected word line node GWL_SEL and the word line decoder 402, causes the voltage level of the global selected word line voltage $V_{GWL\_SEL}$ to increase or ramp up from the read unselected word line level $V_{WLU}$ to the read selected word line level $V_{WL\_RD}$ at a desired rate.

In addition, similar to the selected bit lines and its neighboring unselected bit lines, the selected word line may also have neighboring word lines, and changes in a voltage level of a selected word line voltage $V_{WL\_SEL}$ may cause changes in voltage levels of neighboring unselected word line voltages $V_{NWL\_USEL}$, such as due to capacitive coupling between neighboring word lines. Similar to a bit line disturb, a word line disturb is an event where a change of a first word line voltage generated on a first word line causes a change in voltage level of a second word line voltage generated on a second word line. A second word line is a neighboring word line to a first word line where the second word line is physically close enough to the first word line such that a change in voltage level of a first word line voltage generated on the first word line causes a change in voltage level of a second word line voltage generated on the second word line. A neighboring word line may be a word line that is physically adjacent to the word line subjected to the voltage change, although a neighboring word line may not be limited to only physically adjacent word lines.

A too high amount of the global word line current $I_{GWL}$ sourced to the global selected word line node GWL_SEL during the word line set period may cause too great of a word line disturb, meaning that the voltage level of the unselected neighboring word line voltage $V_{NWL\_USEL}$ may increase undesirably too high above the read unselected word line voltage level $V_{WLU}$. It may be undesirable for the unselected neighboring word line voltage $V_{NWL\_USEL}$ to be too far above the read unselected word line voltage level $V_{WLU}$ at the time that the selected memory cell MC(s) turns on (if programmed in the low resistance state).

Accordingly, during the word line set period, the high amount of the global word line current $I_{GWL}$ sourced to the global selected word line node GWL_SEL may be within an optimal range having a lower bound set to a minimum threshold current amount corresponding to the leakage current amount and an upper bound set to a maximum threshold current amount corresponding to a word line disturb event. The word line read voltage generator 406 generating the global word line current $I_{GWL}$ at an amount above the minimum threshold current amount may cause the global selected word line voltage $V_{WL\_SEL}$ to increase or ramp up to the read selected word line voltage level $V_{WL\_RD}$ at a desirable rate despite the leakage current. At the same time, the word line read voltage generator 406 generating the global word line current $I_{GWL}$ at an amount below the maximum threshold current amount may cause the unselected neighboring word line voltage $V_{NWL\_SEL}$ not to increase too far away from the read unselected word line voltage level $V_{WLU}$ so that the unselected neighboring word line voltage $V_{NWL\_SEL}$ is not consequently too far away from the read unselected word line voltage level $V_{WLU}$ when the read voltage difference causes the selected memory cell MC(s) to turn on.

When the selected word line voltage $V_{WL\_SEL}$ reaches the read selected word line voltage level $V_{W\_RD}$, the corresponding read voltage difference across the selected memory cell MC(s) may be at the predetermined read voltage difference level, which may start the memory cell response period. The memory cell response period is a period during which the selected memory cell MC(s) behaves or responds in a certain way in response to the read voltage difference across the selected memory cell MC(s) being at the predetermined read voltage difference level. In particular, if the selected memory cell MC(s) is programmed in a high resistance state, then the read voltage difference at the predetermined read voltage difference level may be below the total threshold voltage of the selected memory cell MC(s). In this case, at the start of and/or during the memory cell response period, the selected memory cell MC(s) may stay turned off and no memory cell current Icell may flow through the selected memory cell MC(s). Alternatively, if the selected memory cell MC(s) is programmed in a low resistance state, then the read voltage difference at the predetermined read voltage difference level may exceed the total threshold voltage of the selected memory cell MC(s). In this case, at the start of the memory cell response period, the selected memory cell MC(s) may turn on or trigger. This latter case, with the selected memory cell MC(s) being in the low resistance state and turning on, is shown in the timing diagram of FIG. 7.

In further detail, in the case when the selected memory cell MC(s) is programmed in the low resistance state and turns on at the start of the memory cell response period, the selected memory cell MC(s) may immediately or rapidly draw or conduct a relatively large amount of memory cell current Icell. Otherwise stated, when the selected memory cell MC(s) initially turns on or triggers, the memory cell current Icell spikes in magnitude from zero or substantially to a relatively large amount. Shortly after the spike, the magnitude of the memory cell current Icell through the selected memory MC(s) begins to decrease or decay, and does so for the remainder of the memory cell response period until the magnitude of the memory cell current Icell reaches a steady decayed level. The portion of the memory cell current Icell that spikes when the selected memory cell MC(s) initially turns on may be referred to a spiked portion of the memory cell current Icell, and the portion of the memory cell current Icell that decays from a peak level of the spiked portion to the steady decayed level may be referred to as the decaying portion.

As shown in FIG. 4, the clamp circuit 412 may have a first terminal coupled to the selected word line, and may have an input terminal, such as a gate terminal, configured to receive a source voltage set to the read unselected word line voltage level $V_{WLU}$. As shown in FIG. 7, at the start of the memory cell response period, the spike in the memory cell current Icell may cause the selected word line voltage $V_{WL\_SEL}$ to rapidly decrease from the read selected word line voltage $V_{WL\_RD}$. In some sense operations, the selected word line voltage $V_{WL\_SEL}$ may decrease down to a threshold voltage level that triggers the clamp circuit 412 to clamp the selected word line voltage $V_{WL\_RD}$ to a clamp voltage level $V_{CLMP}$. In response to the clamp circuit 412 clamping the selected word line voltage $V_{WL\_RD}$ to the clamp voltage level $V_{CLMP}$, the voltage level of the selected word line voltage $V_{WL\_RD}$ may be held constant or substantially constant to the clamp voltage level $V_{CLMP}$ irrespective of external currents that may otherwise change the voltage level of the selected word line voltage $V_{WL\_RD}$. The clamp circuit 412 may hold or clamp the selected word line voltage $V_{WL\_RD}$ to the clamp voltage level $V_{CLMP}$ until the clamp circuit 412 deactivates and releases its clamp on the selected word line voltage $V_{WL\_RD}$.

In some example configurations, the clamp circuit 412 may be configured as a diode clamp circuit, such as a diode-connected NMOS transistor. The selected word line voltage $V_{WL\_SEL}$ dropping in response to the selected memory cell MC(s) turning on may correspond or be equal to a diode voltage drop from the read unselected word line level $V_{WLU}$, which in turn may cause the diode or diode-connected NMOS transistor to turn on and clamp the selected word line voltage $V_{WL\_SEL}$ to the clamp voltage level $V_{CLMP}$.

For at least some example configurations, in the event that the decrease in the selected word line voltage $V_{WL\_SEL}$ triggers the clamp circuit 412 when the selected memory cell MC(s) turns on, a current path may form that includes the clamp circuit 412 (e.g., such as from a second terminal biased with a supply voltage (e.g., the first (high) supply voltage) VH), the selected word line, the selected memory cell MC(s), the selected bit line, the bit line decoder 404, the global selected bit line node GBL_SEL and the bit line read voltage generator 408.

In the event that the clamp circuit 412 triggers and the current path is formed, the clamp circuit 412 may not be able to limit the amount of the memory cell current Icell flowing through the selected memory cell MC(s). Referring to FIG. 6, in the event that the second current branch 606 is turned on at the start of the memory cell response period when the selected memory cell MC(s) triggers, the second current branch 606, including the second NMOS transistor N2, may also not be able to limit the amount of the memory cell current Icell. Otherwise stated, when the second branch 606 is turned on, the selected memory cell MC(s) may be configured to conduct the memory cell current Icell at an uninhibited decaying amount and rate over the memory cell response period, and the second branch 606 may not affect or reduce the amount of the memory cell current Icell and/or may not increase the rate at which the magnitude of the memory cell current Icell is decaying during the memory cell response period.

During the memory cell response period, in the event that the magnitude of the memory cell current Icell does not decay to a low enough steady decayed level and/or does not decay at a fast enough rate, the magnitude of the memory cell current Icell may cause a false write on the selected memory cell MC(s). A false write on the selected memory cell MC(s) may occur when the magnitude of the memory cell current Icell is at too high of a level for too long of a period of time that the memory cell current Icell changes the program state of the selected memory cell MC(s) from the low resistance state to the high resistance state.

The risk of a false write may be avoided, or at least minimized, by switching the bit line read voltage generator 408 from the high current mode to the low current mode before the start of the memory cell response period when the read voltage difference reaches the predetermined read voltage difference level and/or the selected memory cell MC(s) triggers on. As previously described, the sense controller 414 switched the bit line read voltage generator 408 from the high current mode to the low current mode at time t1 after the selected bit line voltage $V_{BL\_SEL}$ reached the read selected bit line voltage level $V_{BL\_RD}$. As previously described, in the low current mode, the bit line read voltage generator 408 may reduce the amount of the global bit line current $I_{GBL}$ it can draw. The bit line read voltage generator 408 may continue to operate in the low drive strength or current mode during the memory cell response period when the selected memory cell MC(s) turns on and conducts the spiked and decaying portions of the memory cell current Icell. Accordingly, when the selected memory cell MC(s) triggers on and the clamp circuit 412 responds by clamping the selected word line voltage $V_{WL\_SEL}$ to the clamp voltage level $V_{CLMP}$, the bit line read voltage generator 408 may operate to affect, such as by reducing or limiting, the amount of the memory cell current Icell through the current path compared to if the second current branch 606 had been kept activated. Consequently, after the memory cell current spikes at the start of the memory cell response period, the memory cell current Icell may decrease or decay at a faster rate and/or to a lower steady decayed level, which in turn may reduce the risk of a false write on the selected memory cell MC(s).

In addition, as shown in FIG. 4, the sense circuit 410 may be coupled to the global selected word line node GWL_SEL and configured to sense, detect, and/or receive the global selected word line voltage $V_{WL\_SEL}$. At the end of the memory cell response period, the sense operation may transition to the sense period, during which the sense circuit 410 may be configured to sense or detect the voltage level of the global selected word line voltage $V_{WL\_SEL}$ or otherwise use the global selected word line voltage $V_{WL\_SEL}$ to identify a logic level of the data stored in the selected memory cell MC(s). In response to the identification, the sense circuit 410 may be configured to output a sense result signal SR indicating the logic level of the data stored in the selected memory cell MC(s). The sense circuit 410 may be configured to output the sense result signal SR to the sense controller 414 or to another circuit component located on the memory die 104 or external to the memory die 104.

In the sense period, in order to identify the logic level of the data stored in the selected memory cell MC(s), the sense circuit 410 may be configured to compare the voltage level of the global selected word line voltage $V_{GWL\_SEL}$ with a trip voltage level Vtp. To compare the voltage level of the global selected word line voltage $V_{GWL\_SEL}$ with the trip voltage level Vtp, the sense circuit 410 may be configured to respond differently depending whether the voltage level of the global selected word line voltage $V_{GWL\_SEL}$ is above or below the trip voltage level Vtp. For example, in the sense period, in the event that the global selected word line voltage $V_{GWL\_SEL}$ is above the trip voltage level Vtp, then the sense circuit 410 may be configured to maintain a level (e.g., a voltage level) of the sense result signal SR at a first (e.g., high) level. On the other hand, in the event that the global selected word line voltage $V_{GWL\_SEL}$ is below the trip voltage Vtp, then the sense circuit 410 may be configured to drop the level of the sense result signals SR from the first level to a second (low) level. The sense result signal SR at the first (high) level may indicate a first logic level or value of the data stored in the selected memory cell MC(s), and the sense result signal SR at the second (low) level may indicate a second logic level or value, different from the first logic level, of the data stored in the selected memory cell MC(s).

Whether the voltage level of the global selected word line voltage $V_{GWL\_SEL}$ is above or below the trip level at the start of the sense period may depend on whether the selected memory cell MC(s) turned on or stayed off in response to the read voltage difference at the predetermined read voltage difference level at the start of the memory cell response period. In the event that the selected memory cell MC(s) is programmed in the high resistance state, then the selected memory cell MC(s) may stay turned off, and in response be prevented from drawing the memory cell current Icell. With the selected memory cell MC(s) staying turned off during the memory cell response period, the voltage level of the global selected word line voltage may stay at a relatively constant level or decrease a relatively small amount such that it is above the trip level Vtp by the start of the sense period.

On the other hand, in the event that the selected memory cell MC(s) is programmed in the low resistance state, then the selected memory cell MC(s) may turn on (or trigger) and in response, draw the memory cell current Icell, as previously described. When the selected memory cell MC(s) turns on, the amount of the memory cell current Icell that the selected memory cell MC(s) is configured to conduct may cause an amount of current to sink from the global selected word line node GWL_SEL, which in turn may cause the voltage level of the global selected word line voltage $V_{GWL\_SEL}$ to decrease compared to if the selected memory cell MC(s) had not turned on. Although the global selected word line voltage $V_{GWL\_SEL}$ may not decrease at nearly the fast rate at which the voltage level of the selected word line voltage $V_{WL\_SEL}$ dropped due to an effective capacitance provided by the global selected word line node GWL_SEL and the word line decoder 402, the global selected word line voltage $V_{GWL\_SEL}$ may nonetheless decrease to below the trip voltage level Vtp by the start of the sense period.

For some example configurations and/or in some example sense operations, the word line read voltage generator 406 may be configured to operate in two current modes, including a high current mode and a low current mode, as previously described. For such configurations, the word line read voltage generator 406 may be configured to switch from operating in the high current mode to operating in the low current mode when or at a time corresponding to when, such as shortly after, the selected word line voltage level $V_{WL\_SEL}$ reaches the read selected word line level $V_{WL\_RD}$. In general, during the memory cell response period, the smaller the amount of the global word line current that the word line read voltage generator 406 supplies to the global selected word line node GWL_SEL, the faster the voltage level of the global selected word line voltage $V_{GWL\_SEL}$ may decrease in response to the selected memory cell MC(s) turning on and conducting the memory cell current Icell. Accordingly, in the event that the selected memory cell MC(s) is programmed in the low resistance state, configuring the word line read voltage generator 406 to operate in the low current mode during the memory cell response period may allow the global selected word line voltage $V_{GWL\_SEL}$ to decrease to below the trip voltage level Vtp at a faster rate compared to if the word line read voltage generator 406 stayed in the high current mode during the duration of the memory cell response period, which in turn may provide an overall faster sense operation. FIG. 7 shows the controller 414 changing the second control signal CTRL2 from a low level to a high level at a time t2 in order to deactivate the first current branch 504, and in turn configure or set the read voltage generator 406 in the low current mode.

Configuring the word line read voltage generator 406 to operate in the low current mode during the memory cell response period when the selected memory cell MC(s) is programmed in the high resistance state may also have certain advantages. In particular, when the selected memory cell MC(s) is in the high resistance state and thus stays turned off in response to the read voltage difference at the predetermined read voltage difference level, an amount of leakage current may still be sinking from the global selected word line node GWL_SEL, causing the voltage level of the global selected word line voltage $V_{GWL\_SEL}$ to want to decrease. If the amount of the leakage current was great enough and no current was simultaneously being sourced to the global selected word line node GWL_SEL, the leakage current may cause the voltage level of the global selected word line voltage $V_{GWL\_SEL}$ to fall below the trip voltage level Vtp by the start of the sense period, which in turn may lead to the sense circuit 410 outputting the sense result signal SR at a level that incorrectly indicates the logic level of the data stored in the selected memory cell MC(s). However, when the word line read voltage generator 406 is operating in the low voltage mode, it is still sourcing the global word line current $I_{GWL}$ at a non-zero amount, albeit lower than the high current amount. The sourcing of the global word line current $I_{GWL}$ at the non-zero amount during the memory cell response period may, at least partially, counteract the effect of the leakage current in wanting to pull down the voltage level of the global selected word line voltage $V_{GWL\_SEL}$, such that the voltage level of the global selected word line voltage $V_{GWL\_SEL}$ may stay above the trip voltage level Vtp by the start of the sense period. As a result, read errors resulting from the sense circuit 410 incorrectly outputting the sense result signal SR due to leakage current when the selected memory cell MC(s) is in the high resistance state may be avoided by configuring the word line read voltage generator 406 in the low current mode during the memory cell response period rather than deactivating the word line read voltage generator 406 altogether.

In addition, in some example sense operations, the decrease in the selected word line voltage $V_{WL\_SEL}$ when the selected memory cell MC(s) turns on may not trigger the clamp circuit 412. For such sense operations, and for configurations where the bit line read voltage generator 408 operates in a single, high current mode, switching the word line read voltage generator 406 to the low current mode may control, such as by reducing or limiting, the amount of the spiked and decaying portions of cell current Icell during the memory cell response period.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a memory array comprising a plurality of memory cells;
   a sense circuit configured to:
      sense a global selected word line voltage of a selected word line; and
      output a sense result signal indicative of a logic level of data stored in a selected memory cell coupled to the selected word line; and
   a voltage generator configured to:
      set a global selected bit line voltage to a selected bit line voltage level according to a drive strength at an initial drive strength level;
      decrease the drive strength of the voltage supply from the initial drive strength level to a decreased drive strength level in response to the global selected bit line voltage set to the selected bit line voltage level; and
      in response to the selected memory cell of the plurality of memory cells turning on, control a memory cell current through the selected memory cell according to the decreased drive strength level.

2. The circuit of claim 1, wherein the voltage generator comprises:
   a first current branch configured to set the global selected bit line voltage according to the drive strength at the initial drive strength level; and
   a second current branch configured to set the global selected bit line voltage according to the drive strength at the decreased drive strength level.

3. The circuit of claim 2, further comprising a controller configured to:
   activate the first current branch to set the global selected bit line voltage according to the drive strength at the initial drive strength level; and
   deactivate the first current branch to set the global selected bit line voltage according to the drive strength at the decreased drive strength level.

4. The circuit of claim 3, wherein the voltage generator is configured to:
   decrease the global selected bit line voltage from an unselected bit line voltage level to the selected bit line voltage level according to the drive strength at the initial drive strength level during an initial portion of a bit line set period of a sense operation; and
   maintain the global selected bit line voltage at the selected bit line voltage level during a remaining portion of the bit line set period and a word line set period.

5. The circuit of claim 2, wherein the first current branch is configured to draw a first branch current at a first branch current level, and
   wherein the second branch current is configured to draw a second branch current at a second branch current level that is lower than the first branch current level.

6. The circuit of claim 1, wherein the selected memory cell is configured to turn on during a sense operation when programmed in a low resistance state, and when turned on, is configured to conduct a spiked portion and a decaying portion of the memory cell current during a memory cell response period, and wherein the voltage generator is configured to conduct a global bit line current according to the drive strength at the decreased drive strength level during the memory cell response period.

7. The circuit of claim 1, wherein the voltage generator is configured to sink a global bit line current from a global selected bit line node according to the drive strength at the decreased drive strength level in order to control the memory cell current.

8. A circuit comprising:
   a memory array comprising a plurality of memory cells;
   means for setting a global selected bit line voltage to a selected bit line voltage level according to a drive strength at an initial drive strength level;
   means for decreasing the drive strength of the voltage supply from the initial drive strength level to a decreased drive strength level in response to the global selected bit line select voltage set to the selected bit line voltage level; and
   means for controlling a memory cell current through the selected memory cell according to the decreased drive strength level in response to the selected memory cell turning on.

9. The circuit of claim 8, further comprising:
   means for setting the global selected bit line voltage according to the drive strength at the initial drive strength level; and
   means for setting the global selected bit line voltage according to the drive strength at the decreased drive strength level.

10. The circuit of claim 9, further comprising:
    means for activating the first current branch to set the global selected bit line voltage according to the drive strength at the initial drive strength level; and
    means for deactivating the first current branch to set the global selected bit line voltage according to the drive strength at the decreased drive strength level.

11. The circuit of claim 10, further comprising:
    means for decreasing the global selected bit line voltage from an unselected bit line voltage level to the selected bit line voltage level according to the drive strength at the initial drive strength level during an initial portion of a bit line set period of a sense operation; and
    means for maintaining the global selected bit line voltage at the selected bit line voltage level during a remaining portion of the bit line set period and a word line set period.

12. The circuit of claim 9, wherein the means for setting the global selected bit line voltage comprises a means for drawing a first branch current at a first branch current level, and
    wherein the means for setting the global selected bit line voltage comprises a means for drawing a second branch current at a second branch current that is lower than the first branch current level.

13. The circuit of claim 8, wherein the selected memory cell is configured to turn on during a sense operation when programmed in a low resistance state, and when turned on, is configured to conduct a spiked portion and a decaying portion of the memory cell current during a memory cell response period, the circuit further comprising means for conducting a global bit line current according to the drive strength at the reduced drive strength level during the memory cell response period.

14. The circuit of claim 8, further comprising means for sinking a global bit line current from a global selected bit line node according to the drive strength at the reduced drive strength level in order to control the memory cell current.

15. A method comprising:
outputting, with a sense circuit, a sense result signal indicative of a logic level of data stored in a selected memory cell of a memory array coupled to a selected word line;
setting, with a voltage generator, a global selected bit line voltage to a selected bit line voltage level according to a drive strength at an initial drive strength level;
decreasing, with the voltage generator, the drive strength of the voltage supply from the initial drive strength level to a decreased drive strength level in response to the global selected bit line voltage set to the selected bit line voltage level; and
in response to the selected memory cell of the plurality of memory cells turning on, controlling, with the voltage generator, a memory cell current through the selected memory cell according to the decreased drive strength level.

16. The method of claim 15, further comprising:
activating, with a controller, a current branch to set the global selected bit line voltage according to the drive strength at the initial drive strength level; and
deactivating, with the controller, the current branch to set the global selected bit line voltage according to the drive strength at the decreased drive strength level.

17. The method of claim 16, further comprising:
decreasing, with the voltage generator, the global selected bit line voltage from an unselected bit line voltage level to the selected bit line voltage level according to the drive strength at the initial drive strength level during an initial portion of a bit line set period of a sense operation; and
maintaining, with the voltage generator, the global selected bit line voltage at the selected bit line voltage level during a remaining portion of the bit line set period and a word line set period.

18. The method of claim 15, further comprising:
drawing, with a first current branch of the voltage generator, a first branch current at a first branch current level to set the global selected bit line voltage to the selected bit line voltage level according to the drive strength at the initial drive strength level; and
drawing, with a second current branch of the voltage generator, a second branch current at a second branch current level that is lower than the first branch current level to set the global selected bit line voltage according to the drive strength at the decreased drive strength level.

19. The method of claim 15, further comprising:
turning on the selected memory cell during a sense operation when programmed in a low resistance state;
conducting, with the selected memory cell, a spiked portion and a decaying portion of the memory cell current during a memory cell response period; and
conducting, with the voltage generator, a global bit line current according to the drive strength at the decreased drive strength level during the memory cell response period.

20. The method of claim 15, further comprising:
sinking, with the voltage generator, a global bit line current from a global selected bit line node according to the drive strength at the decreased drive strength level in order to control the memory cell current.

* * * * *